(12) United States Patent
Tsukao

(10) Patent No.: US 9,953,947 B2
(45) Date of Patent: Apr. 24, 2018

(54) ANISOTROPIC CONDUCTIVE FILM AND CONNECTION STRUCTURE

(71) Applicant: DEXERIALS CORPORATION, Tokyo (JP)

(72) Inventor: Reiji Tsukao, Utsunomiya (JP)

(73) Assignee: DEXERIALS CORPORATION, Tokyo (JP)

(*) Notice: Subject to any disclaimer, the term of this patent is extended or adjusted under 35 U.S.C. 154(b) by 6 days.

(21) Appl. No.: 15/517,781

(22) PCT Filed: Oct. 28, 2015

(86) PCT No.: PCT/JP2015/080338
§ 371 (c)(1),
(2) Date: Apr. 7, 2017

(87) PCT Pub. No.: WO2016/068169
PCT Pub. Date: May 6, 2016

(65) Prior Publication Data
US 2017/0309590 A1    Oct. 26, 2017

(30) Foreign Application Priority Data
Oct. 28, 2014    (JP) .................................. 2014-219788

(51) Int. Cl.
*H01L 23/48*    (2006.01)
*H01L 23/52*    (2006.01)
(Continued)

(52) U.S. Cl.
CPC .............. *H01L 24/32* (2013.01); *H01L 24/27* (2013.01); *H01L 24/29* (2013.01);
(Continued)

(58) Field of Classification Search
CPC .. H01L 2224/16012; H01L 2224/32225; H01L 31/0512; H01L 2224/2929;
(Continued)

(56) References Cited

U.S. PATENT DOCUMENTS

| | | | | |
|---|---|---|---|---|
| 5,688,584 A | * | 11/1997 | Casson | H05K 3/323 |
| | | | | 174/259 |
| 2007/0212521 A1 | * | 9/2007 | Bessho | C09J 7/026 |
| | | | | 428/137 |
| 2017/0226387 A1 | * | 8/2017 | Shinohara | C09J 9/02 |

FOREIGN PATENT DOCUMENTS

| | | |
|---|---|---|
| JP | H05-82199 A | 4/1993 |
| JP | H09-320345 A | 12/1997 |

(Continued)

OTHER PUBLICATIONS

Jan. 12, 2016 International Search Report issued in International Patent Application No. PCT/JP2015/080338.
(Continued)

*Primary Examiner* — S. V. Clark
(74) *Attorney, Agent, or Firm* — Oliff PLC

(57) ABSTRACT

An anisotropic conductive film whereby electrically conductive particles can be sufficiently captured at each connection terminal while suppressing the occurrence of shorts and conduction reliability can be improved even in cases where connecting finely pitched connection terminals. The anisotropic conductive film has a structure in which electrically conductive particle units in which electrically conductive particles are arranged in a row, or electrically conductive particle units in which electrically conductive particles are arranged in a row and independent electrically conductive particles are disposed in a lattice form in an electrically insulating adhesive layer. The shortest distance La between electrically conductive particles selected from adjacent electrically conductive particle units and the independent electrically conductive particles are disposed in a lattice form in an electrically conductive particles are disposed in a lattice form in an electrically insulating adhesive layer. The shortest distance La between electrically conductive particles selected from adjacent electrically conductive particle units and the independent elec-
(Continued)

trically conductive particles is not less than 0.5 times the particle diameter of the electrically conductive particles.

7 Claims, 22 Drawing Sheets

(51) Int. Cl.
    *H01L 29/40*     (2006.01)
    *H01L 23/00*     (2006.01)

(52) U.S. Cl.
    CPC ........... *H01L 2224/27003* (2013.01); *H01L 2224/2711* (2013.01); *H01L 2224/27462* (2013.01); *H01L 2224/27464* (2013.01); *H01L 2224/2929* (2013.01); *H01L 2224/2939* (2013.01); *H01L 2224/29444* (2013.01); *H01L 2224/29455* (2013.01); *H01L 2224/29499* (2013.01); *H01L 2224/32145* (2013.01); *H01L 2224/32225* (2013.01)

(58) Field of Classification Search
    CPC ... H05K 3/323; H05K 3/321; C09J 2201/602; C09J 7/00; C90J 9/02
    USPC ........................................ 257/782, 783, 787
    See application file for complete search history.

(56) References Cited

FOREIGN PATENT DOCUMENTS

| | | |
|---|---|---|
| JP | 2002-519473 A | 7/2002 |
| JP | 2006-049783 A | 2/2006 |
| JP | 2007-165052 A | 6/2007 |
| JP | 2013-206823 A | 10/2013 |

OTHER PUBLICATIONS

Nov. 1, 2016 Written Opinion issued in International Patent Application No. PCT/JP2015/080338.
Jan. 12, 2016 Written Opinion issued in International Patent Application No. PCT/JP2015/080338.
Feb. 9, 2017 International Preliminary Report on Patentability issued in International Patent Application PCT/JP2015/080338.

* cited by examiner (A-A CROSS-SECTIONAL VIEW)

(B-B CROSS-SECTIONAL VIEW)

(C-C CROSS-SECTIONAL VIEW)

Table 1A

| | Electrically conductive particle disposal | Number of connected particles | Particle diameter (μm) | Maximum length of unit (μm) | Angle θ (°) | Shortest distance of unit La (μm) | Particle density (pcs/mm²) | (a-1) Connected object for evaluation 400 μm² (10 × 40 μm, space 10 μm) | | | Short number |
|---|---|---|---|---|---|---|---|---|---|---|---|
| | | | | | | | | Conduction resistance (Ω) | Minimum number of particles captured per bump | State of particles between bumps | |
| Example 1 | θ=90, Anisotropic conductive film longitudinal direction | 2 | 3 | 6 | 90 | 3 | 37000 | 0.4 | 11 | 0/100 | 0/100 |
| Example 2 | θ=45 | 2 | 3 | 6 | 45 | 3 | 37000 | 0.4 | 12 | 0/100 | 0/100 |
| Example 3 | θ=0 | 2 | 3 | 6 | 0 | 3 | 37000 | 0.4 | 11 | 0/100 | 0/100 |
| Example 4 | | 2 | 3 | 6 | 90 | 1.5 | 44000 | 0.4 | 13 | 0/100 | 0/100 |
| Example 5 | | 2 | 3 | 6 | 45 | 1.5 | 44000 | 0.4 | 14 | 0/100 | 0/100 |
| Example 6 | | 2 | 3 | 6 | 0 | 1.5 | 44000 | 0.4 | 13 | 0/100 | 0/100 |
| Example 7 | | 2 | 3 | 6 | 90 | 9 | 28000 | 0.6 | 8 | 0/100 | 0/100 |
| Example 8 | | 2 | 3 | 6 | 45 | 9 | 28000 | 0.5 | 9 | 0/100 | 0/100 |
| Example 9 | | 2 | 3 | 6 | 0 | 9 | 28000 | 0.6 | 7 | 0/100 | 0/100 |
| Example 10 | | 2 | 3 | 6 | 30 | 3 | 37000 | 0.4 | 12 | 0/100 | 0/100 |
| Example 11 | | 2 | 3 | 6 | 60 | 3 | 37000 | 0.4 | 11 | 0/100 | 0/100 |
| Comparative Example 1 | La | 1 | 6 | 6 | - | 3 | 12000 | 0.8 | 2 | 8/100 | 4/100 |
| Comparative Example 2 | La | 1 | 9 | 9 | - | 3 | 7000 | 1.2 | 0 | 19/100 | 15/100 |

FIG. 16A

Table 1B

| | Electrically conductive particle disposal | Number of connected particles | Particle diameter (μm) | Maximum length of unit (μm) | Angle θ (°) | Shortest distance of unit La (μm) | Particle density (pcs/mm²) | (a-2) Connected object for evaluation 300 μm² (6 × 50 μm, space 10 μm) | | (a-3) Connected object for evaluation 200 μm² (4 × 50 μm, space 10 μm) | |
|---|---|---|---|---|---|---|---|---|---|---|---|
| | | | | | | | | Conduction resistance (Ω) | Minimum number of particles captured per bump | Conduction resistance (Ω) | Minimum number of particles captured per bump |
| Example 1 | θ=90, La (diagram) | 2 | 3 | 6 | 90 | 3 | 37000 | <1 | A | <1 | B |
| Example 2 | θ=45 (diagram) | 2 | 3 | 6 | 45 | 3 | 37000 | <1 | A | <1 | B |
| Example 3 | θ=0 (diagram) | 2 | 3 | 6 | 0 | 3 | 37000 | <1 | A | <1 | C |
| Example 4 | | 2 | 3 | 6 | 90 | 1.5 | 44000 | <1 | A | <1 | A |
| Example 5 | | 2 | 3 | 6 | 45 | 1.5 | 44000 | <1 | A | <1 | A |
| Example 6 | | 2 | 3 | 6 | 0 | 1.5 | 44000 | <1 | B | <1 | B |
| Example 7 | | 2 | 3 | 6 | 90 | 9 | 28000 | <1 | B | <1 | C |
| Example 8 | | 2 | 3 | 6 | 45 | 9 | 28000 | <1 | B | <1 | C |
| Example 9 | | 2 | 3 | 6 | 0 | 9 | 28000 | <1 | B | <1 | C |
| Example 10 | | 2 | 3 | 6 | 30 | 3 | 37000 | <1 | A | <1 | B |
| Example 11 | | 2 | 3 | 6 | 60 | 3 | 37000 | <1 | A | <1 | B |

FIG. 16B

[Table 2]

| | Electrically conductive particle disposal | Number of connected particles | Particle diameter (μm) | Maximum length of unit (μm) | Angle θ (°) | Shortest distance of unit La (μm) | Particle density (pcs/mm²) | Conduction resistance (Ω) | Short number | Minimum number of particles captured per bump | State of particles between bumps |
|---|---|---|---|---|---|---|---|---|---|---|---|
| Reference Example 1 | θ=90, Anisotropic conductive film longitudinal direction | 3 | 3 | 9 | 90 | 3 | 42000 | 0.4 | 0/100 | 12 | 0/100 |
| Reference Example 2 | | 4 | 2 | 8 | 90 | 1 | 89000 | 0.4 | 0/100 | 23 | 0/100 |
| Reference Example 3 | θ=0, La | 3 | 2 | 6 | 0 | 1 | 86000 | 0.4 | 0/100 | 21 | 0/100 |
| Reference Example 4 | | 3 | 3 | 9 | 0 | 3 | 42000 | 0.4 | 1/100 | 10 | 13/100 |
| Reference Example 5 | | 4 | 3 | 12 | 0 | 3 | 44000 | 0.4 | 6/100 | 12 | 24/100 |

FIG. 17

[Table 3]

| Electrically conductive particle disposal | Number of connected particles | Particle diameter (μm) | Maximum length of unit (μm) | Angle θ (°) | Spacing between electrically conductive particles in unit Lj (μm) | Shortest distance of unit La (μm) | Particle density (pcs/mm²) | Conduction resistance (Ω) | Short number | Minimum number of particles captured per bump | State of particles between bumps |
|---|---|---|---|---|---|---|---|---|---|---|---|
| Example 1 | 2 | 3 | 6 | 90 | 0 | 3 | 37000 | 0.4 | 0/100 | 11 | 0/100 |
| Example 12 | 2 | 3 | 6.6 | 90 | 0.6 | 2.4 | 37000 | 0.4 | 0/100 | 11 | 0/100 |
| Example 13 | 2 | 3 | 7 | 90 | 1 | 2 | 37000 | 0.4 | 0/100 | 12 | 0/100 |
| Example 14 | 2 | 3 | 7.2 | 90 | 1.2 | 1.8 | 37000 | 0.4 | 0/100 | 12 | 0/100 |

FIG. 18

ANISOTROPIC CONDUCTIVE FILM AND CONNECTION STRUCTURE

TECHNICAL FIELD

The present invention relates to an anisotropic conductive film, and a connection structure connected using the anisotropic conductive film.

BACKGROUND ART

Anisotropic conductive film is widely used in the mounting of electronic components such as IC chips and the like. In recent years, from the perspective of application in high density mounting, in order to increase electrically conductive particle capturing efficiency and connection reliability and reduce short occurrence rates, technology has been proposed in which particle sites (electrically conductive particle units) of electrically conductive particles arranged contacting or in close proximity are disposed in a lattice form in an electrically insulating adhesive layer, and spacing between these electrically conductive particle units is changed depending on an electrode pattern (Patent Document 1).

CITATION LIST

Patent Literature

Patent Document 1: Japanese Unexamined Patent Application Publication (Translation of PCT Application) No. 2002-519473A

SUMMARY OF INVENTION

Technical Problem

However, with the anisotropic conductive film described in Patent Document 1, the spacing between the electrically conductive particle units is limited by the distance between recesses of the transfer mold forming the units. Consequently, when the distance between connection terminals of electronic components connected by the anisotropic conductive film is a fine pitch of about 10 μm, there are problems with conduction reliability such as that connection terminals occur that cannot sufficiently capture conductive particles, shorts occur, and the like.

As such, an object of the present invention is to sufficiently capture electrically conductive particles at each connection terminal while suppressing the occurrence of shorts and increase conduction reliability, even in cases where using an anisotropic conductive film to connect finely pitched connection terminals.

Solution to Problem

The present inventor discovered that with the anisotropic conductive film described in Patent Document 1, the spacing between the electrically conductive particle units is limited by the spacing between the recesses of the transfer mold and not according to the shortest distance between adjacent electrically conductive particles. Moreover, the present inventor discovered that the spacing between the recesses of the transfer mold is not adapted for finely pitched connection terminals. The present inventor discovered that these problems can be solved by limiting the shortest distance between the electrically conductive particles of adjacent electrically conductive particle units and arrived at the present invention.

Specifically, the present invention provides an anisotropic conductive film including electrically conductive particle units in which electrically conductive particles are arranged in a row, or electrically conductive particle units in which electrically conductive particles are arranged in a row and independent electrically conductive particles, disposed in a lattice form in an electrically insulating adhesive layer. In such an anisotropic conductive film, a shortest distance between electrically conductive particles selected from adjacent electrically conductive particle units and independent electrically conductive particles is not less than 0.5 times a particle diameter of the electrically conductive particles.

Additionally, the present invention provides a connection structure including the anisotropic conductive film described above; a first electronic component; and a second electronic component. In this connection structure, a connection terminal of the first electronic component and a connection terminal of the second electronic component are anisotropically conductively connected using the anisotropic conductive film.

Advantageous Effects of Invention

According to the anisotropic conductive film of the present invention, electrically conductive particle units in which electrically conductive particles arranged in a row, or electrically conductive particle units in which electrically conductive particles arranged in a row and independent electrically conductive particles are disposed in a lattice form. As such, the electrically conductive particles can be disposed at a higher density compared to an anisotropic conductive film in which independent electrically conductive particles are arranged in a lattice form. Particularly, the shortest distance between electrically conductive particles selected from adjacent electrically conductive particle units and independent electrically conductive particles is configured to be in a predetermined range. As such, the occurrence of shorts can be suppressed, and the disposition density of electrically conductive particles in the anisotropic conductive film can be maximized. Therefore, even when the connection terminals connected by the anisotropic conductive film are finely pitched, electrically conductive particles will be sufficiently captured at each of the connection terminals and, as a result, conduction reliability can be improved.

BRIEF DESCRIPTION OF DRAWINGS

FIG. 16A and FIG. 16B include tables showing results in Examples 1 to 11 and Comparative Examples 1 and 2.

FIG. 17 includes a table showing results in Reference Examples 1 to 5.

FIG. 18 includes a table showing results in Examples 1 and 12 to 14.

DESCRIPTION OF EMBODIMENTS

Figure 1A:
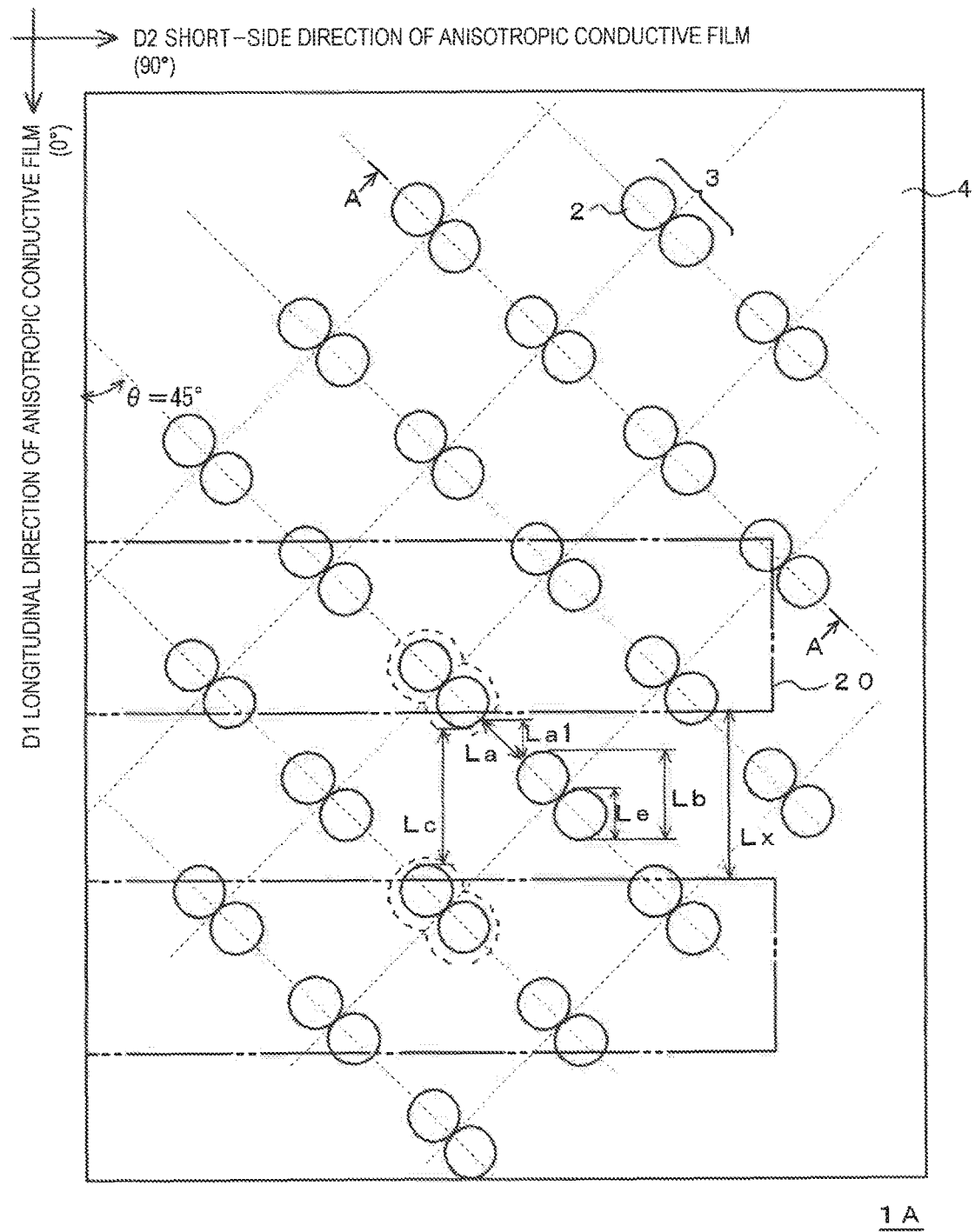
FIG. 1A is a disposition diagram of electrically conductive particles in an anisotropic conductive film 1A of the examples.

Next, the present invention will be described in detail while referring to the drawings. Note that in the drawings, identical reference signs indicate the same or equivalent constituents.

FIG. 1A is a disposition diagram of electrically conductive particles 2 in an anisotropic conductive film 1A of an embodiment of the present invention. In the anisotropic conductive film 1A, electrically conductive particle units 3, in which two electrically conductive particles 2 are arranged, are disposed in a lattice form in an electrically insulating adhesive layer 4. More specifically, the centers of the electrically conductive particle units 3 are disposed at lattice points of a square lattice, indicated by the dashed lines.

Figure 3:
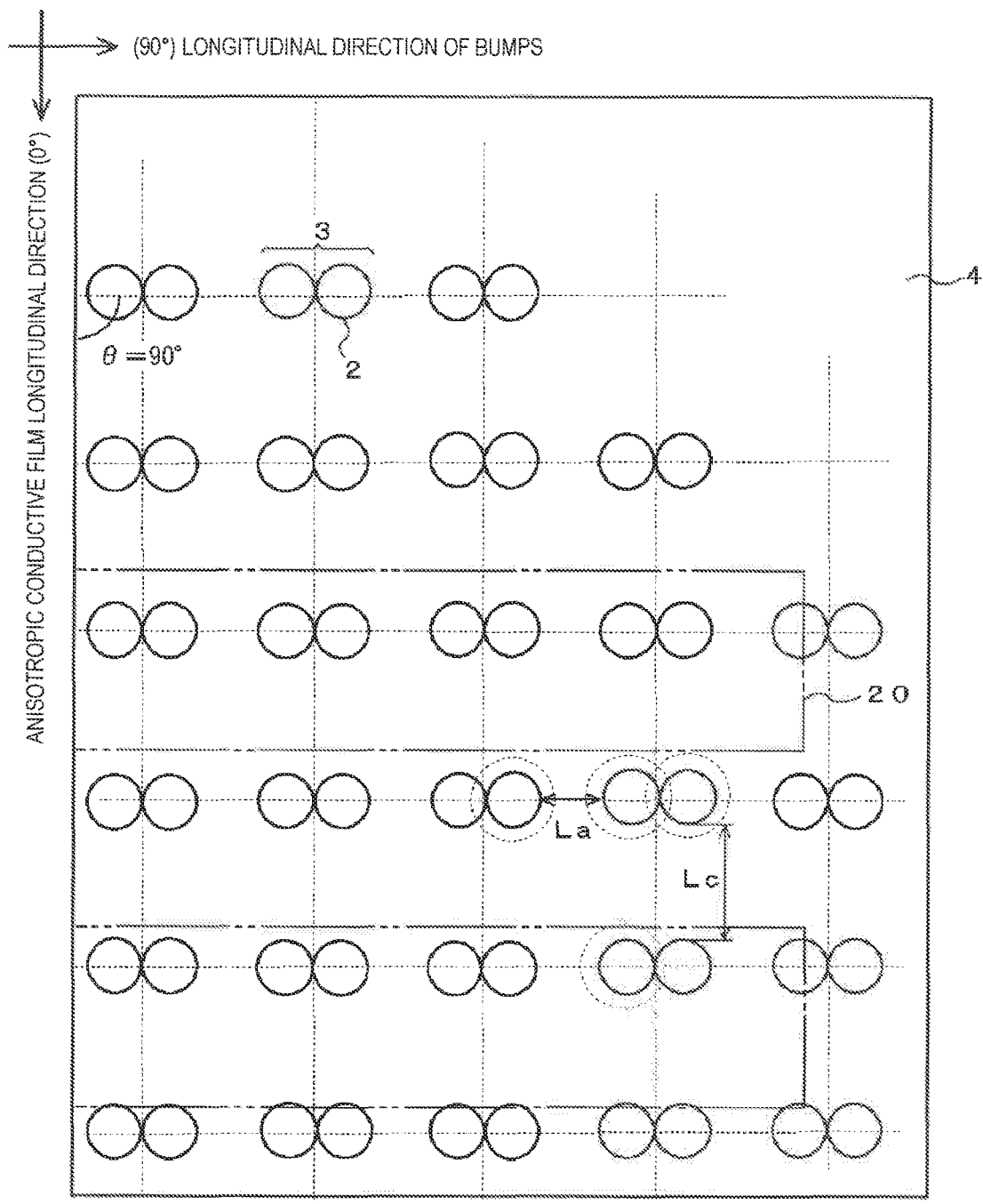
FIG. 3 is a disposition diagram of electrically conductive particles in an anisotropic conductive film 1B of the examples.

Within each of the electrically conductive particle units 3, the electrically conductive particles 2 may be in contact with each other, or may be near each other with a spacing. However, the total size of the spacing within each of the electrically conductive particle units 3 (the total of the sizes of n−1 spacings, where one of the electrically conductive particle units is constituted by arrangement of n electrically conductive particles) is smaller than a particle diameter Le of the electrically conductive particles 2 and preferably is less than ¼ of the particle diameter Le of the electrically conductive particles 2. A reason for this is because the advantageous effects of the present invention, namely, the arrangement of the electrically conductive particle units in a lattice form, are enhanced. Note that, in cases where an angle θ of the longitudinal direction of the electrically conductive particle units with respect to the longitudinal direction of the anisotropic conductive film is great, the total size of the spacing within the electrically conductive particle unit 3 can be increased compared to when the angle θ is small. Additionally, as illustrated in FIG. 3 (described later), the advantageous effects of the present invention can be obtained in cases where the angle θ is 900, even if the total size of the spacing is ½ the particle diameter Le of the electrically conductive particles 2.

In the present invention, the particle diameter Le of the electrically conductive particles 2 is preferably uniform. Here, unless otherwise noted, in the present invention, "particle diameter Le of the electrically conductive particles 2" refers to an average particle diameter of the electrically conductive particles 2 constituting the anisotropic conductive film.

Orientation of the longitudinal direction of each of the electrically conductive particle units 3 is uniform and is inclined with respect to a longitudinal direction D1 of the anisotropic conductive film 1A. More specifically, the angle θ of the longitudinal direction of the electrically conductive particle units 3 with respect to the longitudinal direction of the anisotropic conductive film 1A is 45°. Additionally, the longitudinal direction of each of the electrically conductive particle units 3 overlaps a straight line (the straight line illustrated as a dashed line in the drawings) that forms the lattice form arrangement of the electrically conductive particle units 3. When the longitudinal direction of the electrically conductive particle units 3 is inclined with respect to the longitudinal direction of the anisotropic conductive film 1A in this manner, the number of electrically conductive particles 2 captured at connection terminals 20 can be increased in cases where connecting connection terminals of electronic components using the anisotropic conductive film 1A.

Figure 1B:
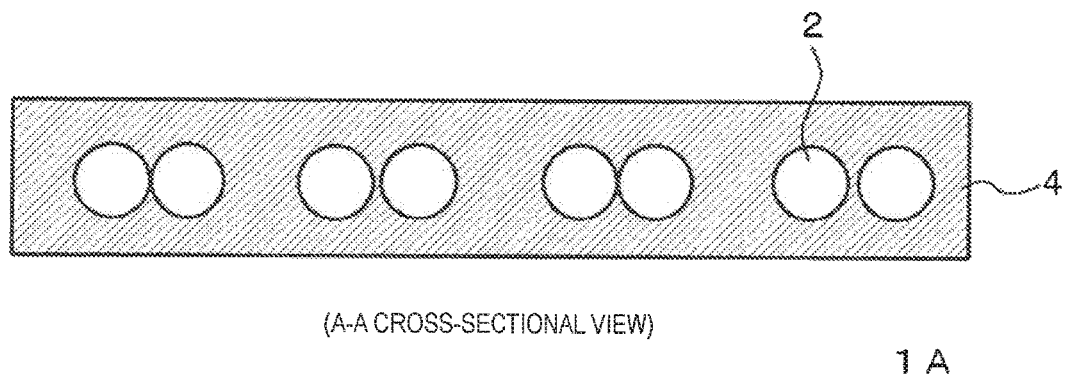
FIG. 1B is a cross-sectional view of the anisotropic conductive film 1A of the examples, taken along line A-A.

FIG. 1B is a cross-sectional view of the anisotropic conductive film 1A taken along line A-A in the longitudinal direction of the electrically conductive particle units 3. As illustrated in FIG. 1B, the electrically conductive particles 2 are embedded to a uniform depth in the electrically insulating adhesive layer 4.

With the anisotropic conductive film 1A of the present invention, from the perspectives of maximizing the disposition density of the electrically conductive particles 2 in the anisotropic conductive film 1A and preventing shorting between terminals when a first and a second electronic component are anisotropically conductively connected using the anisotropic conductive film 1A, a shortest distance La between electrically conductive particles of adjacent electrically conductive particle units (as described later, in cases where independent electrically conductive particles also exist at lattice points, a shortest distance La between electrically conductive particles selected from adjacent electrically conductive particle units and independent electrically conductive particles) is not less than 0.5 times the particle diameter of the electrically conductive particles 2. A reason for configuring the shortest distance La to be not less than 0.5 times the particle diameter of the electrically conductive particles 2 is as follows. Specifically, when a first and a second electronic component are anisotropically conductively connected using the anisotropic conductive film 1A, the electrically conductive particles 2 between the connection terminals of the opposing first and second electronic components collapse and, as illustrated by the dashed line circles in FIG. 1A, the particle diameter of these electrically conductive particles 2 become 1.2 to 1.3 times larger compared to the particle diameter prior to connection. As such, in order to ensure that a spacing of at least about ¼ the particle diameter remains open between the electrically conductive particles and prevent the occurrence of shorts even when both of the electrically conductive particles of the adjacent electrically conductive particle units 3, which have the shortest distance, collapse to the utmost at a time of anisotropic conductive connecting, the shortest distance La between the adjacent electrically conductive particle units is configured to be not less than 0.5 times the particle diameter.

In the present invention, a length La1 in the anisotropic conductive film longitudinal direction D1 of the shortest distance La is preferably configured to be not greater than 10 times the particle diameter Le of the electrically conductive particles 2. A reason for this is because setting the number density of conductive particles to a certain value or higher leads to the stable capturing of the electrically conductive particles at the connection terminals 20, and contributes to the stability of finely pitched connections.

Furthermore, depending on the arrangement pattern of the lattice form of the electrically conductive particle units 3, a circumscribing line in the anisotropic conductive film longitudinal direction D1 of the electrically conductive particle units 3 preferably overlaps the electrically conductive particle units 3 adjacent in the same direction D1 (that the circumscribing line passes through the conductive particles of the adjacent units). A reason for this is because the number density of the electrically conductive particles increases in such a configuration, which contributes to the stability of finely pitched connections.

Note that with the anisotropic conductive film 1A illustrated in FIG. 1A, the direction of the shortest distance La is configured as the longitudinal direction of the electrically conductive particle units 3. In the present invention, the direction of the shortest distance La is not limited to the longitudinal direction of the electrically conductive particle units 3.

In cases where the anisotropic conductive film 1A is used to anisotropically conductively connect connection terminals, from the perspective of easily comparing the electrically conductive particles before and after connecting, the longitudinal direction D1 of the anisotropic conductive film 1A is preferably aligned with an arrangement direction of the connection terminals 20 (a short-side direction of the connection terminals 20) indicated by the dot-dot-dash line in FIG. 1A. In other words, a short-side direction D2 of the anisotropic conductive film 1A is aligned with the longitudinal direction of the connection terminals 20. In this case, a length Lb in the longitudinal direction D1 of the anisotropic conductive film 1A of each of the electrically conductive particle units 3, a distance Lx between the connection terminals 20 connected by the anisotropic conductive film 1A, and the particle diameter Le of the electrically conductive particles satisfy the relationship of the following formula.

$$Lx > (Lb + Le)$$

Additionally, a distance Lc in the longitudinal direction D1, between the electrically conductive particles 2 of adjacent electrically conductive particle units 3, which are the closest electrically conductive particles overlapping in the longitudinal direction D1 of the anisotropic conductive film 1A (that is, electrically conductive particles, which are the closest, for which projected images overlap each other when the electrically conductive particles 2 are projected in the longitudinal direction of the anisotropic conductive film 1A), is preferably not less than 0.5 times the particle diameter of the electrically conductive particles. That is, even if the lattice form arrangement of the electrically conductive particle units 3 itself is the same, the distance Lc changes in accordance with the angle θ of the longitudinal direction of the electrically conductive particle units 3 with respect to the longitudinal direction D1 of the anisotropic conductive film 1A. As such, in order to prevent shorts between adjacent connection terminals 20, a distance Lc of not less than 0.5 times the particle diameter of the electrically conductive particles is preferably secured, regardless of the size of the angle θ.

In the present invention, from the perspective of short prevention and stability of the connection between the connection terminals, the particle diameter of the electrically conductive particles 2 is preferably from 1 to 10 μm and more preferably from 2 to 4 μm. Additionally, the disposition density of the electrically conductive particles 2 is preferably from 2000 to 250000 particles/mm$^2$ and more preferably from 4000 to 100000 particles/mm$^2$. The disposition density of the electrically conductive particles is appropriately adjusted depending on the number of the electrically conductive particles 2 constituting the electrically conductive particle units 3 and the arrangement of the electrically conductive particle units 3.

In the present invention, the configuration of the electrically conductive particles 2 themselves and the layer configuration or constituent resin of the electrically insulating adhesive layer 4 are not particularly limited. That is, any material used in conventional anisotropic conductive films may be appropriately selected and used as the electrically conductive particles 2. Examples thereof include particles of metals such as nickel, cobalt, silver, copper, gold, palladium, and metal-coated resin particles. A combination of two or more materials may also be used.

Any electrically insulating resin layer used in conventional anisotropic conductive films may be appropriately used as the electrically insulating adhesive layer 4. Examples thereof include a photo-radical polymerization type resin layer containing an acrylate compound and a photo-radical polymerization initiator, a thermal radical polymerization type resin layer containing an acrylate compound and a thermal radical polymerization initiator, a thermal cationic polymerization type resin layer containing an epoxy compound and a thermal cationic polymerization initiator, and a thermal anionic polymerization type resin layer containing an epoxy compound and a thermal anionic polymerization initiator. Additionally, as necessary, polymerized products of these resin layers may be used. Moreover, the electrically insulating adhesive layer 4 may be formed from a plurality of resin layers.

Furthermore, an electrically insulating filler such as silica fine particles, alumina, aluminum hydroxide, or the like may be added to the electrically insulating adhesive layer 4 as necessary. The compounded amount of the electrically insulating filler is preferably from 3 to 40 parts by mass per 100 parts by mass of resin included in the electrically insulating adhesive layer. Thereby, even if the electrically insulating adhesive layer 4 melts at the time of anisotropic conductive connecting, it will be possible to prevent the electrically conductive particles 2 from being moved unnecessarily by the melted resin.

An example of a method of manufacturing the anisotropic conductive film in which the electrically conductive particles 2 are fixed in the electrically insulating adhesive layer 4 at the arrangement described above includes fabricating a mold having recesses corresponding to the arrangement of the electrically conductive particle units 3 by machining, laser processing, photolithography, or similar known method; placing the electrically conductive particles into the mold; filling the mold with an electrically insulating adhesive layer forming composition; curing; removing the product from the mold; and, as necessary, further laminating an electrically insulating adhesive layer. With regards to the mold in which the electrically conductive particles 2 are placed, a mold obtained by first fabricating a mold with high rigidity and then using that mold to fabricate a mold using a material of low rigidity may be used.

Figure 2A:
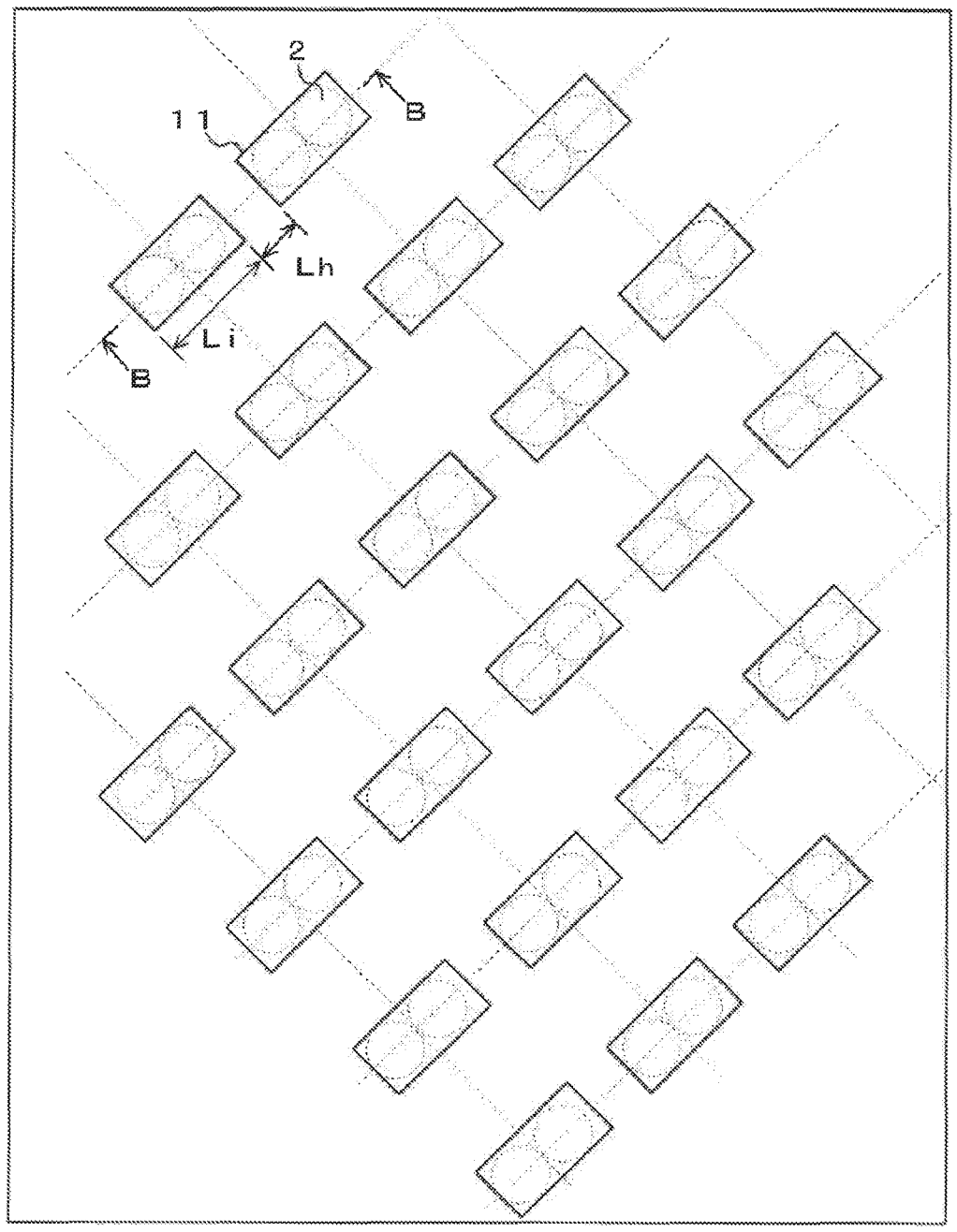
FIG. 2A is a plan view of a mold used in the manufacture of the anisotropic conductive film 1A of the examples.
Figure 2B:
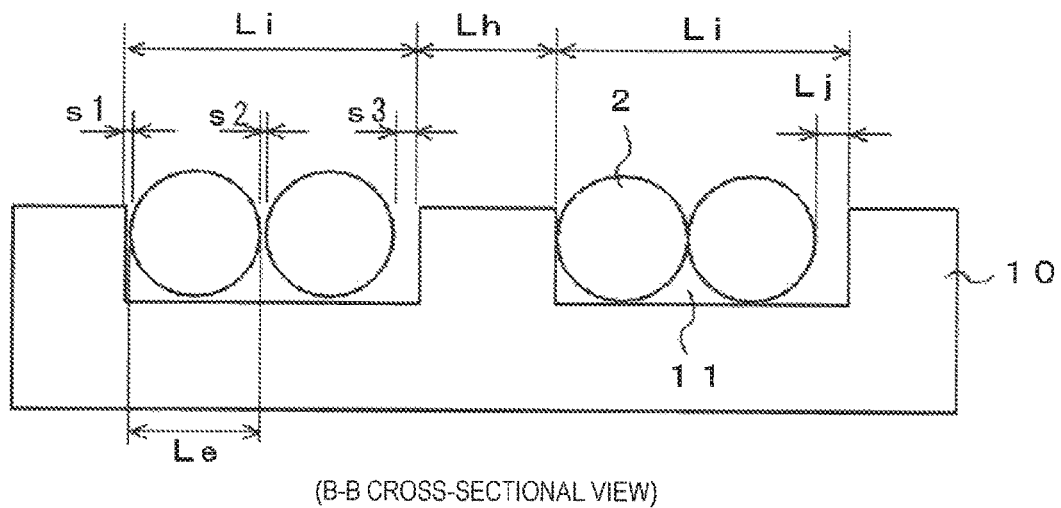
FIG. 2B is a cross-sectional view of a mold used in the manufacture of the anisotropic conductive film 1A of the examples, taken along line B-B.

FIG. 2A is a plan view of a mold 10 used in the manufacture of the anisotropic conductive film 1A to fix the electrically conductive particles 2 at the arrangement described above. FIG. 2B is a cross-sectional view of the mold 10 in a state filled with the electrically conductive particles 2, taken along line B-B. This mold 10 includes rectangular recesses 11 capable of being filled with two of the electrically conductive particles 2. In the anisotropic conductive film 1A of the present example, a distance Lh between recesses 11 that are adjacent in the longitudinal direction of the recesses 11 corresponds to the shortest distance La between adjacent electrically conductive particle units 3. As such, the distance Lh is set to be not less than 0.5 times the particle diameter of the electrically conductive particles 2. Additionally, while dependent on the number of the electrically conductive particles 2 with which the recesses 11 are filled, a length Li in the longitudinal direction of the recesses 11 is preferably set to a length such that a total length Lj of spaces s1, s2, and s3 in the longitudinal direction of the recesses 11, after the recesses 11 have been filled with the electrically conductive particles 2, is less than ¼ the particle diameter of the electrically conductive particles 2. This configuration is to make a state in which the electrically conductive particles are arranged in a lattice form as electrically conductive particle units clearly distinguishable from a state in which the electrically conductive particles are not formed in units but are arranged in a lattice form. This configuration leads to further enhancement of the advantageous effects of the present invention, namely, the arrangement of the electrically conductive particle units in a lattice form.

On the other hand, a method including providing a member, in which through-holes provided in a predetermined arrangement are formed, on the electrically insulating adhesive layer forming composition; supplying the electrically conductive particles 2 from there above; and causing the electrically conductive particles 2 to pass through the through-holes may be used to place the electrically conductive particles 2 in the electrically insulating adhesive layer 4 at the arrangement described above.

Figure 4:
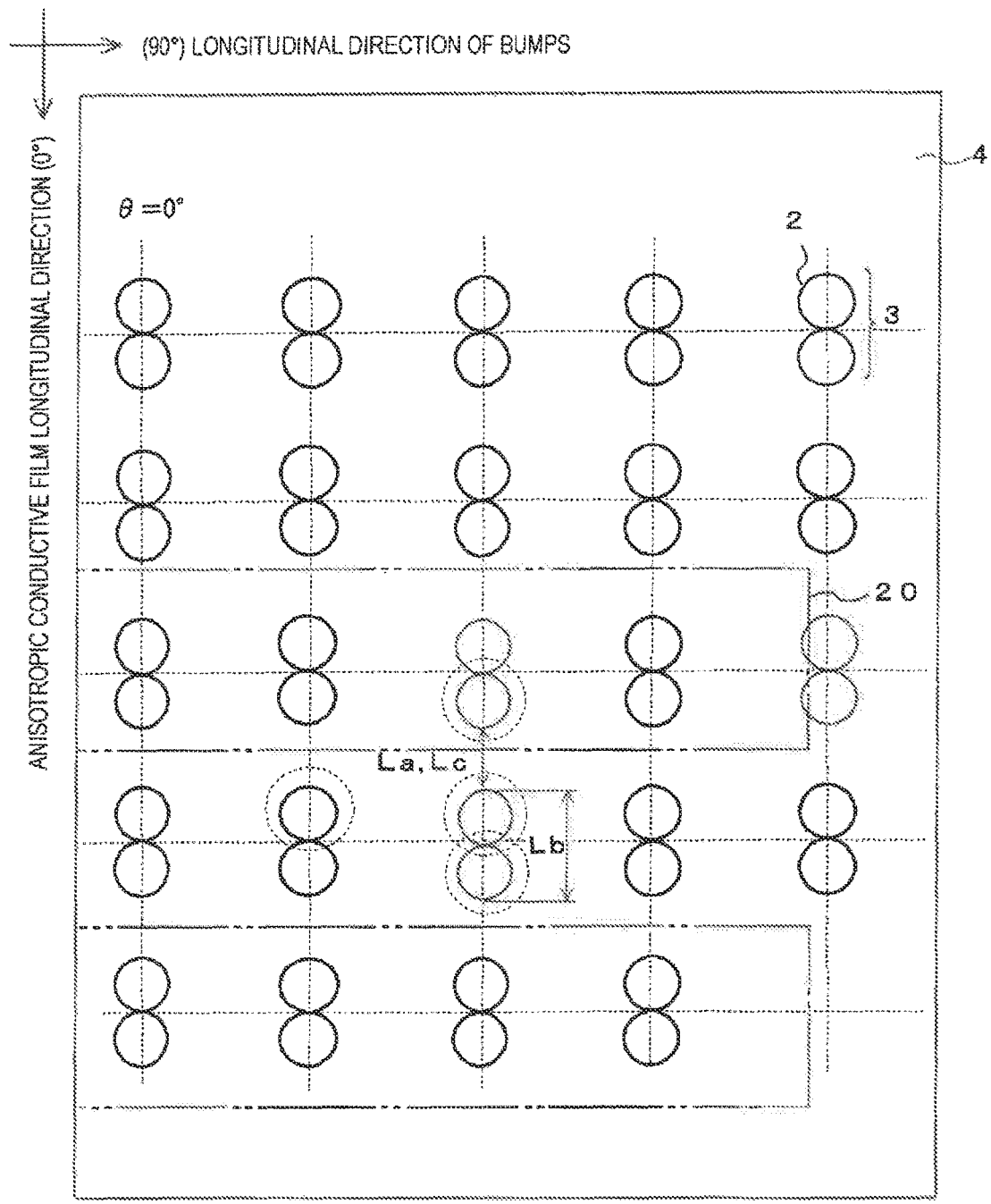
FIG. 4 is a disposition diagram of electrically conductive particles in an anisotropic conductive film 1C of the examples.

The anisotropic conductive film of the present invention can take various forms. For example, as with the arrangement of the electrically conductive particles 2 in the anisotropic conductive film 1A illustrated in FIG. 1A, with an anisotropic conductive film 1B illustrated in FIG. 3 and an anisotropic conductive film 1C illustrated in FIG. 4, the electrically conductive particle units 3 are formed from two of the electrically conductive particles 2, the orientation of the longitudinal direction of each of the electrically conductive particle units 3 is uniform, and the electrically conductive particle units 3 are arranged in a square lattice form. However, with the anisotropic conductive film 1B illustrated in FIG. 3, the angle θ of the longitudinal direction of the electrically conductive particle units 3 with respect to the longitudinal direction of the anisotropic conductive film 1B is 90°, and with the anisotropic conductive film 1C illustrated in FIG. 4, the angle θ of the longitudinal direction of the electrically conductive particle units 3 with respect to the longitudinal direction of the anisotropic conductive film 1C is 0°.

From the perspective of short prevention, the angle θ is preferably closer to 900. Additionally, from the perspective of capturing electrically conductive particles at the anisotropic conductive connections, the angle θ is preferably closer to 0°. As such, in cases where the number of electrically conductive particles forming each of the electrically conductive particle units 3 and the angle θ of the longitudinal direction of each of the electrically conductive particle units 3 are uniform, from the perspective of achieving both short prevention and electrically conductive particle capturing, the angle θ is preferably from 6 to 84° and more preferably from 16 to 74°.

Figure 5:
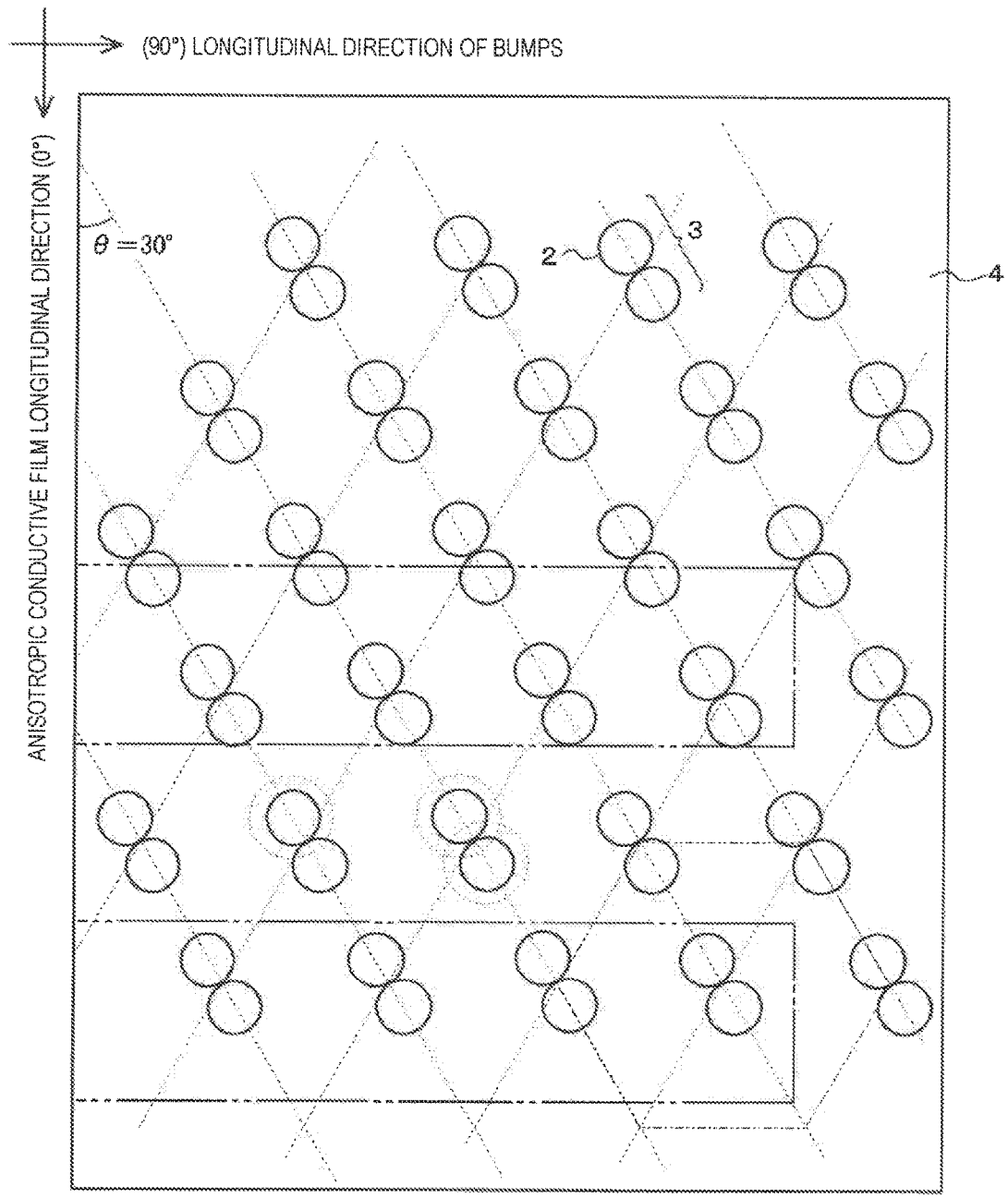
FIG. 5 is a disposition diagram of electrically conductive particles in an anisotropic conductive film 1D of the examples.

An anisotropic conductive film 1D illustrated in FIG. 5 is the anisotropic conductive film 1A illustrated in FIG. 1A, wherein the electrically conductive particle units 3 are arranged such that center points of the electrically conductive particle units 3 form a hexagonal lattice, and the angle θ of the longitudinal direction of the electrically conductive particle units 3 with respect to the longitudinal direction of the anisotropic conductive film 1D is 30°.

Additionally, in the present invention, the arrangement of the lattice form of the electrically conductive particle units 3 can take various other forms. For example, the electrically conductive particle units 3 may be arranged in an oblique lattice form, a rectangular lattice form, or the like.

Figure 6:
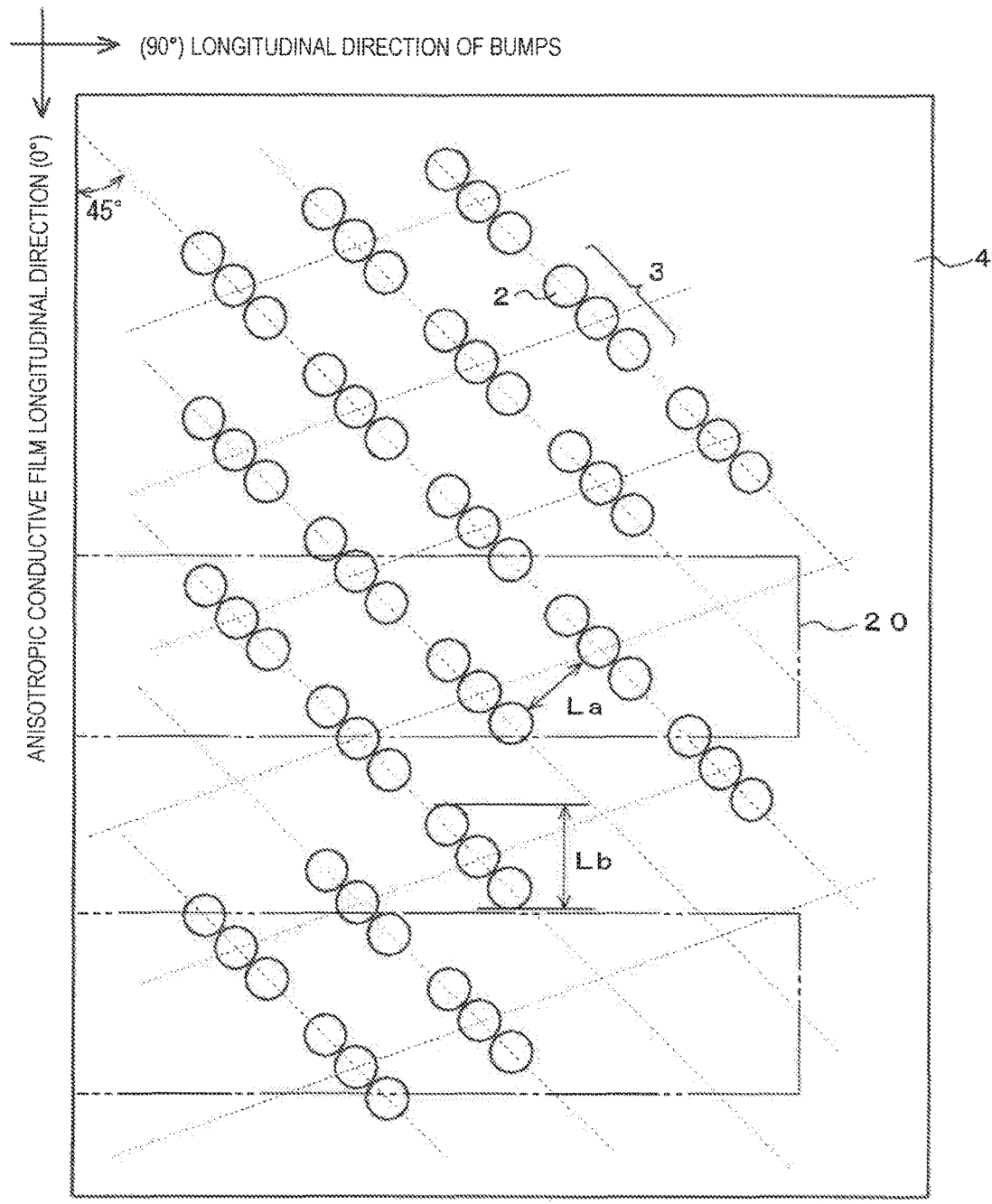
FIG. 6 is a disposition diagram of electrically conductive particles in an anisotropic conductive film 1E of the examples.

With an anisotropic conductive film 1E illustrated in FIG. 6, each of the electrically conductive particle units 3 is formed from three of the electrically conductive particles 2 that are arranged in a line, the electrically conductive particle units 3 are disposed in an oblique arrangement, and the angle θ of the longitudinal direction of the electrically conductive particle units 3 with respect to the longitudinal direction of the anisotropic conductive film 1E is 45°.

Thus, the number of the electrically conductive particles 2 constituting the electrically conductive particle units 3 is not limited to two, and can be determined in accordance with the electrically conductive particle diameter, the distance between the terminals to be connected, the size and layout of the terminals, and the like. Therefore, an upper limit of the number of the electrically conductive particles 2 constituting the electrically conductive particle units 3 is not particular limited. This is because, even in cases of finer pitches and/or greater miniaturization, the risk of short occurrence declines when there is sufficient distance corresponding to the electrically conductive particle diameter between the terminals. From the perspectives of further reducing short occurrence risk and stabilizing the quality of the connection structure during manufacturing, independent electrically conductive particles 2a that do not form electrically conductive particle units may be interposed between the electrically conductive particle units that are arranged in the lattice form, or the number of electrically conductive particles 2 constituting one of the electrically conductive particle units 3 can be set to from 2 to 8 particles and preferably to from 2 to 5 particles.

Figure 7:
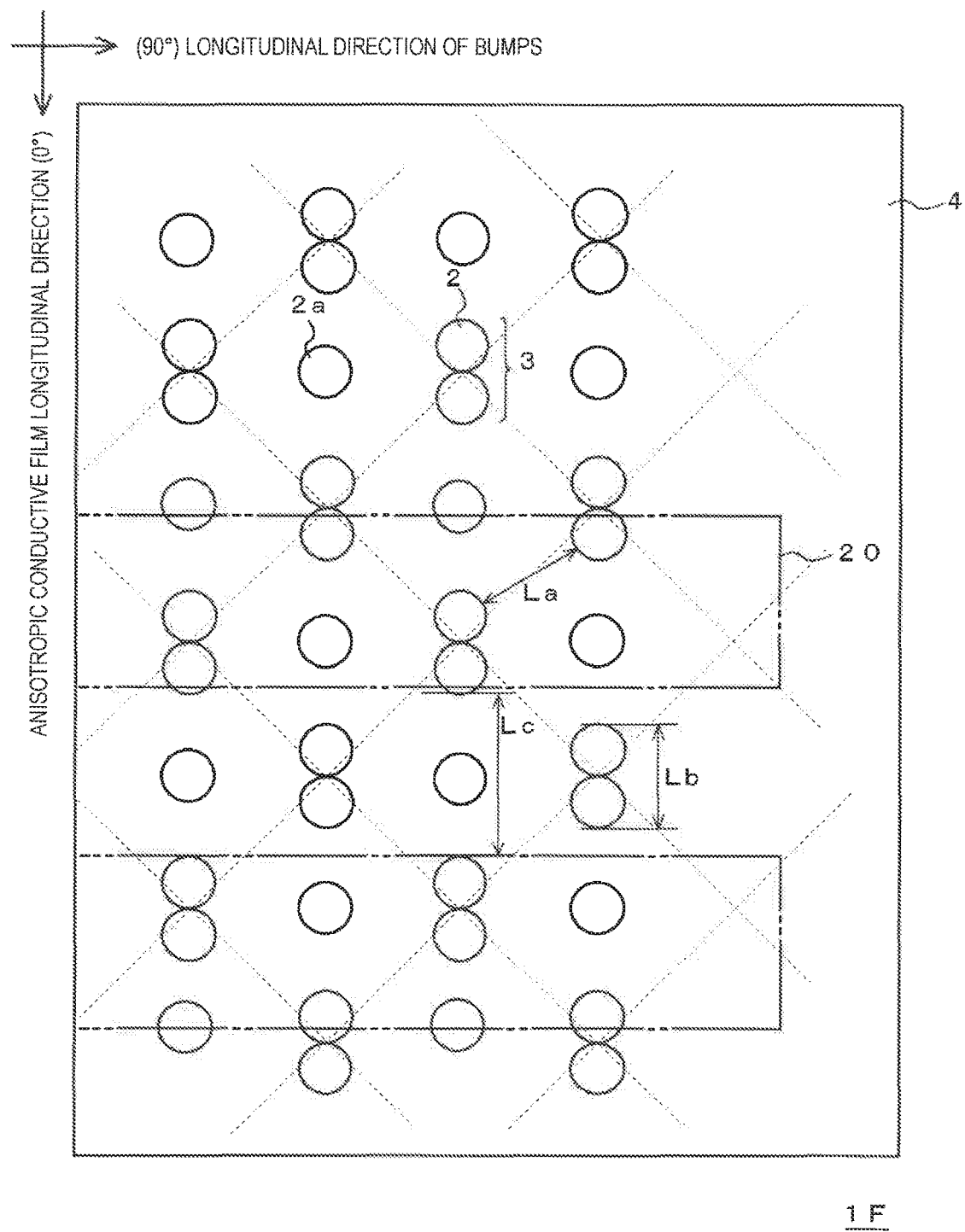
FIG. 7 is a disposition diagram of electrically conductive particles in an anisotropic conductive film 1F of the examples.

For example, as in an anisotropic conductive film 1F illustrated in FIG. 7, the independent electrically conductive particles 2a that do not form electrically conductive particle units may be placed at the centers of unit cells of the electrically conductive particle units 3 that are arranged in a square lattice form. As a result, even in cases where using the anisotropic conductive film with finely pitched connection terminals, the capturability of electrically conductive particles at the connection terminals can be enhanced and shorts can be prevented.

Figure 8:
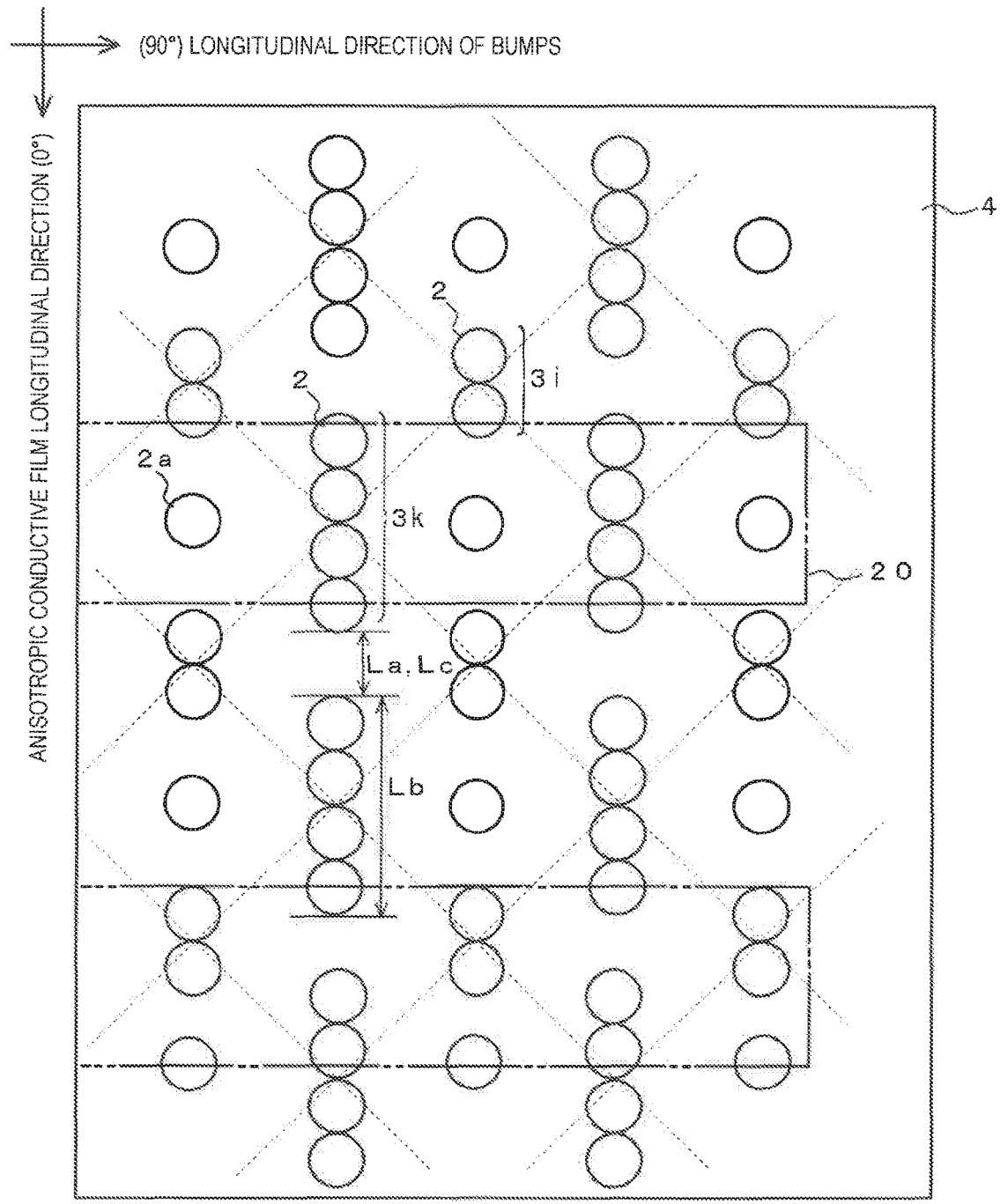
FIG. 8 is a disposition diagram of electrically conductive particles in an anisotropic conductive film 1G of the examples.

Additionally, as in an anisotropic conductive film 1G illustrated in FIG. 8, a plurality of types of electrically conductive particle units 3i and 3k, in which the number of electrically conductive particles forming the electrically conductive particle units differs, may be arranged in a lattice form, and the independent electrically conductive particles 2a may be disposed at sites other than the lattice points. Note that in cases where disposing the plurality of types of electrically conductive particle units 3i and 3k, in which the number of electrically conductive particles forming the electrically conductive particle units differs, in a lattice form, the center of each of the electrically conductive particle units 3i and 3k may be disposed on a lattice point.

Figure 9:
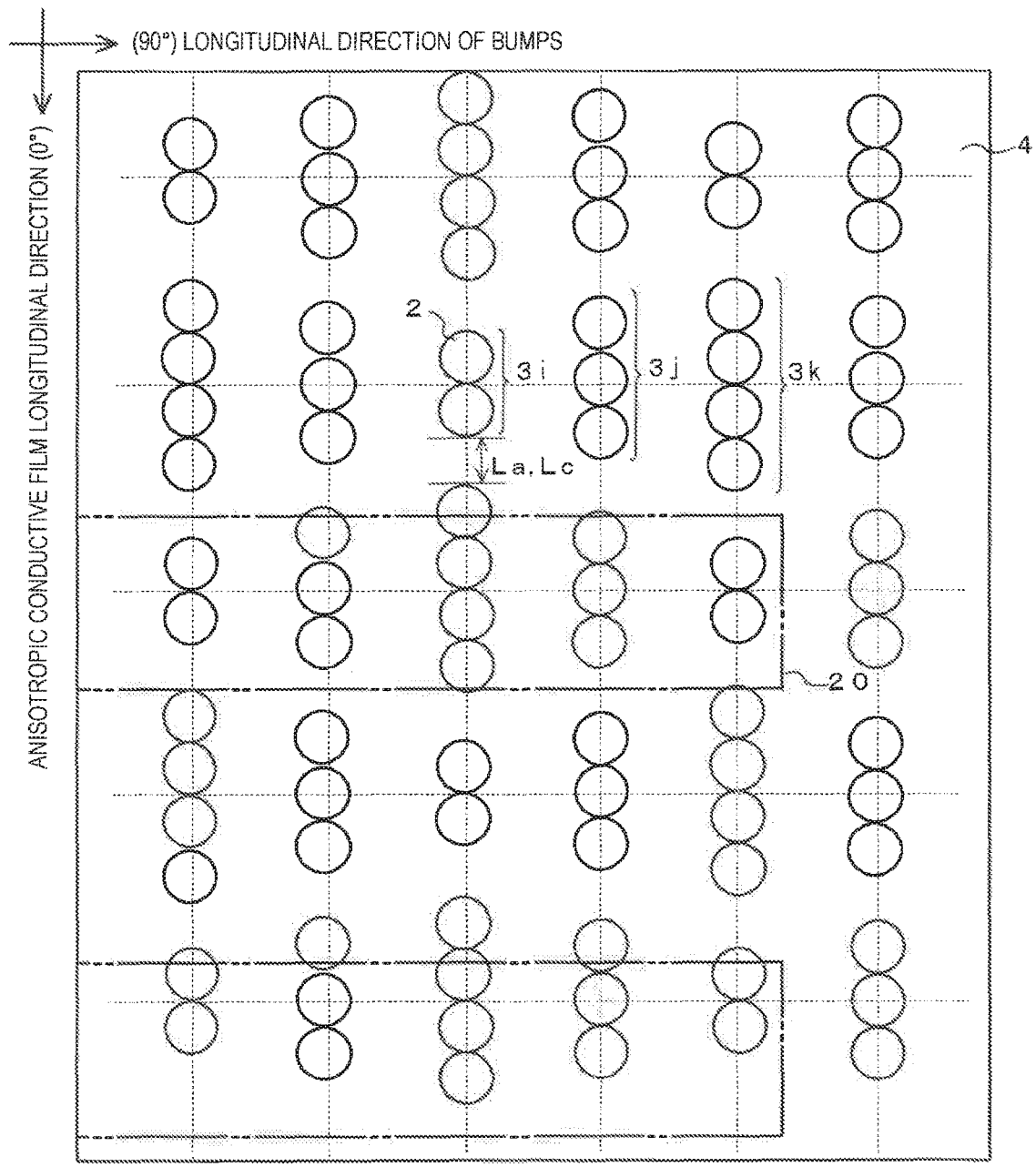
FIG. 9 is a disposition diagram of electrically conductive particles in an anisotropic conductive film 1H of the examples.

As in an anisotropic conductive film 1H illustrated in FIG. 9, in cases where disposing the plurality of types of electrically conductive particle units 3i, 3j, and 3k, in which the number of electrically conductive particles forming the electrically conductive particle units differs, in a lattice form, the longitudinal direction of each of the electrically conductive particle units 3i, 3j, and 3k may be made uniform, and the number of electrically conductive particles of the electrically conductive particle units disposed in short-side directions thereof may be configured to gradually increase or decrease in a repetitive manner. Note that in FIG. 9, the longitudinal directions of the three types of electrically conductive particle units 3i, 3j, and 3k are configured as the longitudinal direction of the anisotropic conductive film 1H but, provided that the longitudinal directions of the electrically conductive particle units 3i, 3j, and 3k are uniform, any direction may be used.

By providing the plurality of types of electrically conductive particle units, in which the number of electrically conductive particles forming the electrically conductive particle units differs, in this manner, capturing efficiency of electrically conductive particles in bumps of small areas can be enhanced and the occurrence of shorts can be suppressed. As such, connections with even finer pitches can be handled.

In the present invention, the electrically conductive particle units and the independent electrically conductive particles may be arranged in a lattice form. In other words, the independent electrically conductive particles may be disposed on lattice points. For example, as in an anisotropic conductive film 1I illustrated in FIG. 10, three types of electrically conductive particle units 3i, 3j, and 3k, in which the number of electrically conductive particles forming the electrically conductive particle units differs, and the independent electrically conductive particles 2a may be arranged in a lattice form. In this case, the shortest distance La between electrically conductive particles selected from the electrically conductive particle units 3i, 3j, and 3k and the independent electrically conductive particles 2a is not less than 0.5 times the electrically conductive particle diameter of the electrically conductive particles 2 and 2a.

Figure 10:
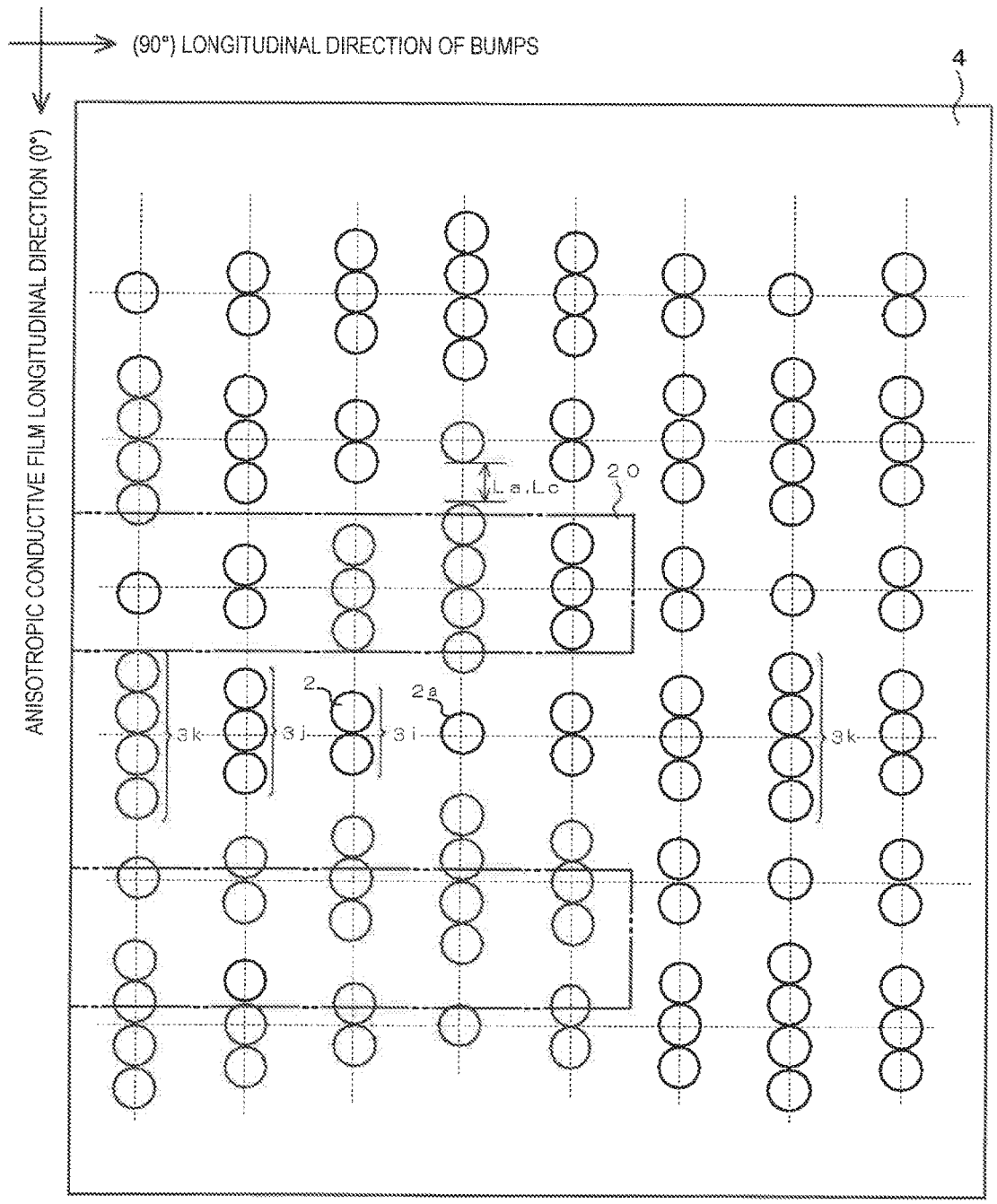
FIG. 10 is a disposition diagram of electrically conductive particles in an anisotropic conductive film 1I of the examples.
Figure 11:
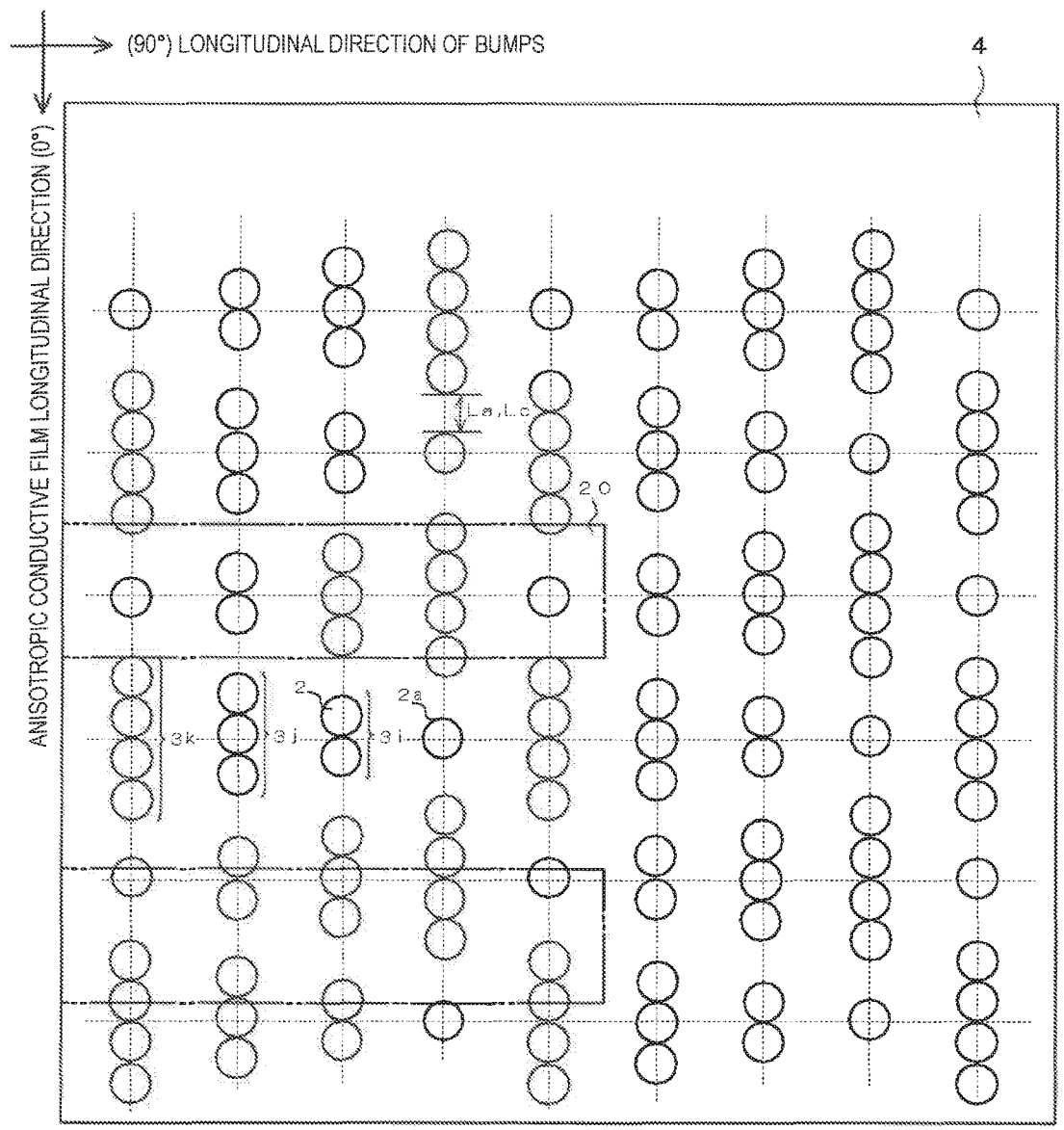
FIG. 11 is a disposition diagram of electrically conductive particles in an anisotropic conductive film 1J of the examples.

When disposing the plurality of types of electrically conductive particle units in which the number of electrically conductive particles differs and the independent electrically conductive particles, as in the anisotropic conductive film 1I illustrated in FIG. 10, the number of electrically conductive particles forming each of the electrically conductive particle units 3i, 3j, and 3k and the independent electrically conductive particles 2a arranged in the short-side direction of the anisotropic conductive film may be configured to gradually increase and decrease in a repetitive manner or, as in an anisotropic conductive film 1J illustrated in FIG. 11, may be configured to gradually increase or decrease in a repetitive manner. As illustrated in FIG. 11, in cases where the electrically conductive particles gradually increase or decrease in a repetitive manner, variation in the number density of the electrically conductive particles in a small area in the anisotropic conductive film is smaller. As a result, for example, when affixing the anisotropic conductive film, even if the affixing position shifts slightly (a few dozen μm or greater even if equal to a few percentage points of the film width) in the longitudinal direction of the connection terminals, this configuration is preferable because variation in the number of the electrically conductive particles captured by the connection terminals is smaller, and variation in pressing force applied to the electrically conductive particles, between cases where positional shift occurs and does not occur, is smaller.

Examples of finely pitched connection terminals include connection terminals for which a size of a connection surface has a width of from 4 to 60 μm and a length not greater than 400 μm (the lower limit is the same as the width), connection terminals for which the width of the connection surface is less than four times the electrically conductive particle diameter or less than two times the length in the longitudinal direction of the electrically conductive particle units 3, and connection terminals for which the shortest distance between the connection terminals is, for example, from 8 to 30 μm. Additionally, the distance between the connection terminals may increase relatively in cases where the area of the connection terminals is small and, as such, the area of the connection terminals is not limited to that described above. Note that, in addition to technical reasons such as higher integration and the like, reducing the area of the connection terminals results in cost benefits because such configurations lead to reductions in the metal (Au and the like) used for the terminals. As such, an anisotropic conductive film that can be used for terminals with small area has great significance.

In the case of a configuration in which three or more of the electrically conductive particles constitute the electrically conductive particle units 3, from the perspective of enhancing the capturability of electrically conductive particles at fine pitches, the electrically conductive particles are arranged in one row in each of the electrically conductive particle units 3.

Figure 12:
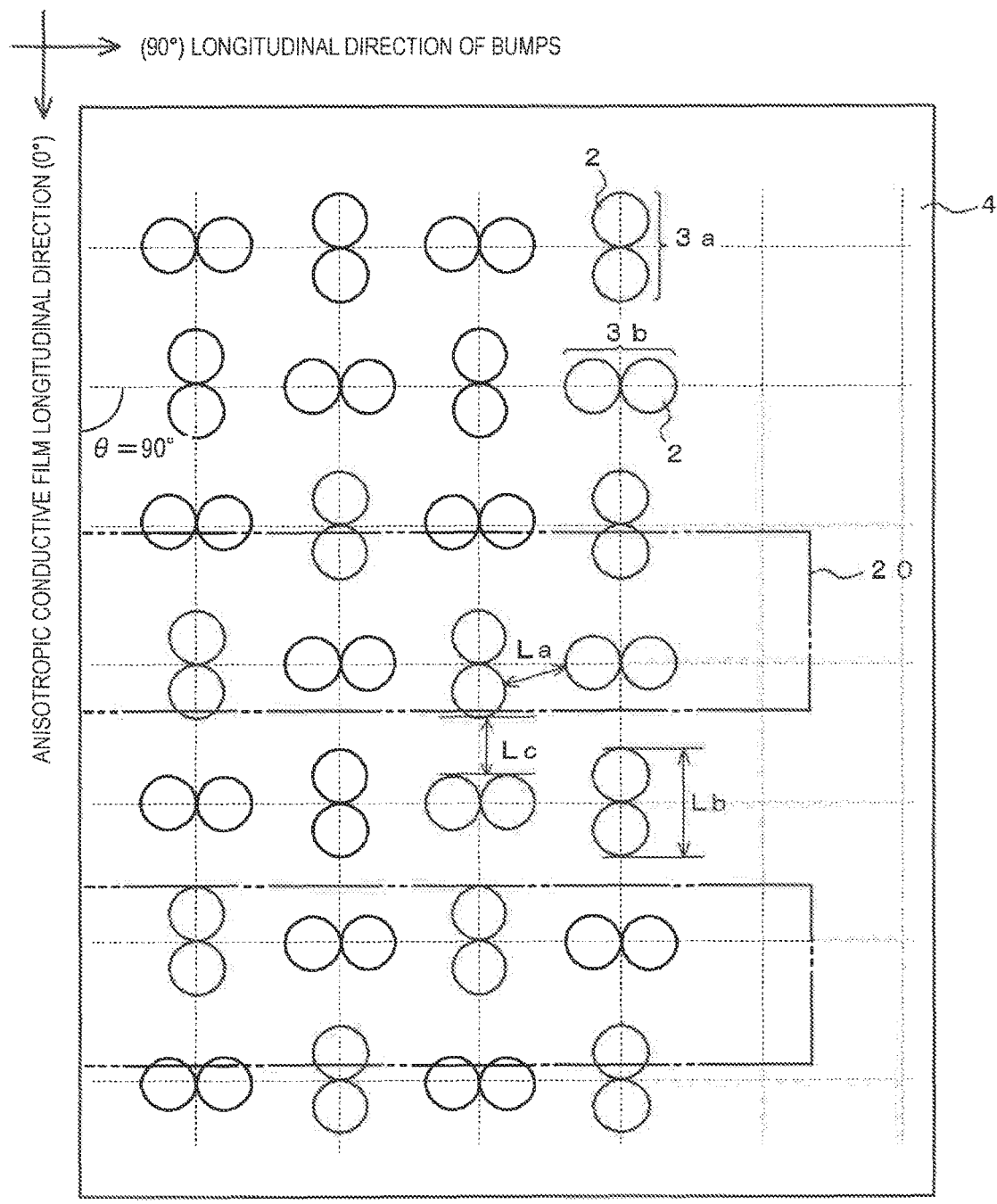
FIG. 12 is a disposition diagram of electrically conductive particles in an anisotropic conductive film 1K of the examples.

In an anisotropic conductive film 1K illustrated in FIG. 12, the longitudinal direction of the electrically conductive particle units 3 is varied in a staggered lattice form. More specifically, the center points of the electrically conductive particle units 3 (3a and 3b) are arranged in a square lattice form as in the anisotropic conductive film 1B illustrated in FIG. 3. However, the arrangement direction of the electrically conductive particles 2 in the electrically conductive particle units 3 includes electrically conductive particle units 3a at 0° and electrically conductive particle units 3b at 90° with respect to the longitudinal direction of the anisotropic conductive film 1K, arranged in a staggered lattice form.

Enhancing of the capturability of electrically conductive particles and short prevention when the connection terminals 20 are finely pitched can both be achieved even when the arrangement direction of the electrically conductive particles 2 in the electrically conductive particle units 3 is configured to include a first direction and a second direction, as described above.

Figure 13A:
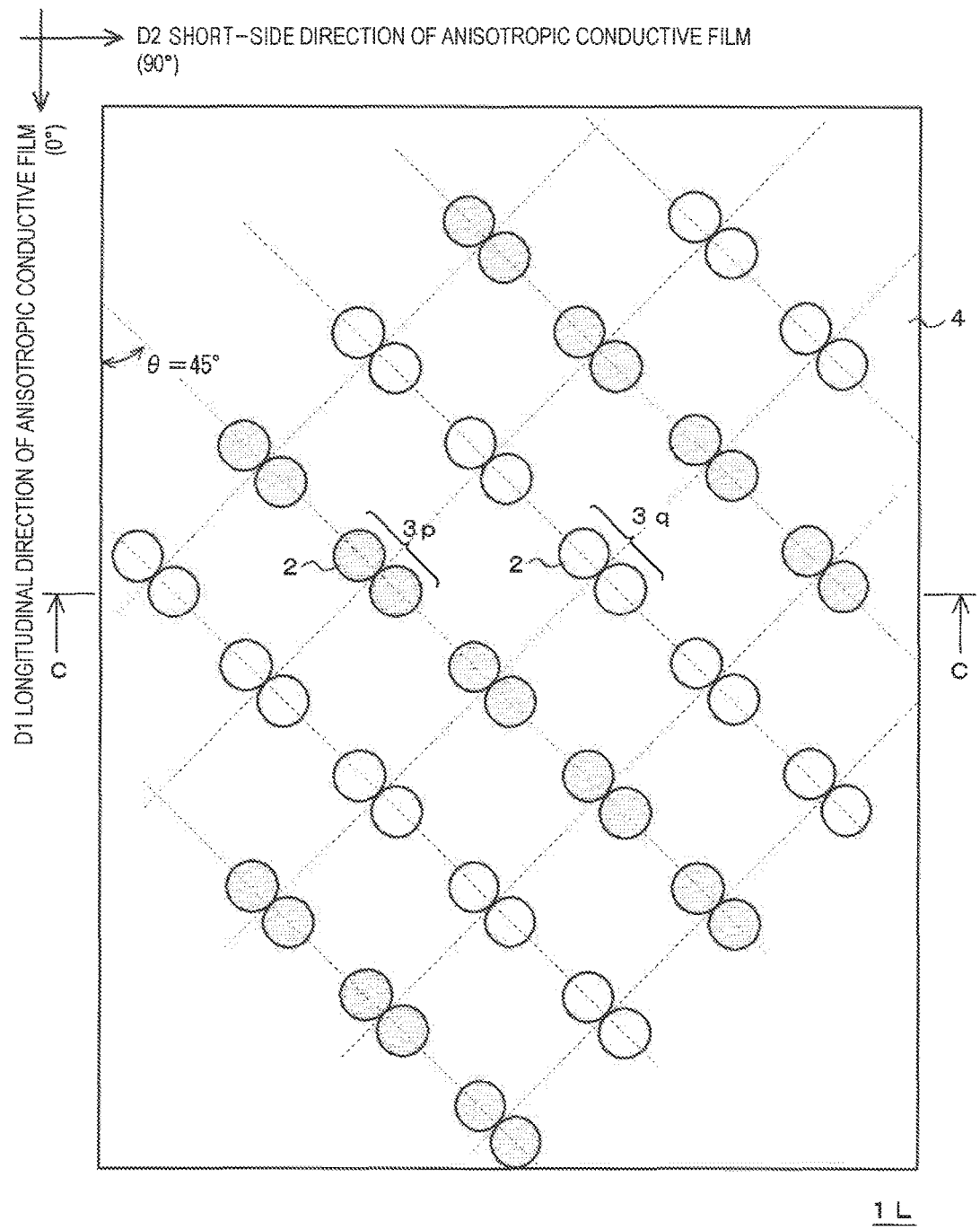
FIG. 13A is a disposition diagram of electrically conductive particles in an anisotropic conductive film 1L of the examples.
Figure 13B:
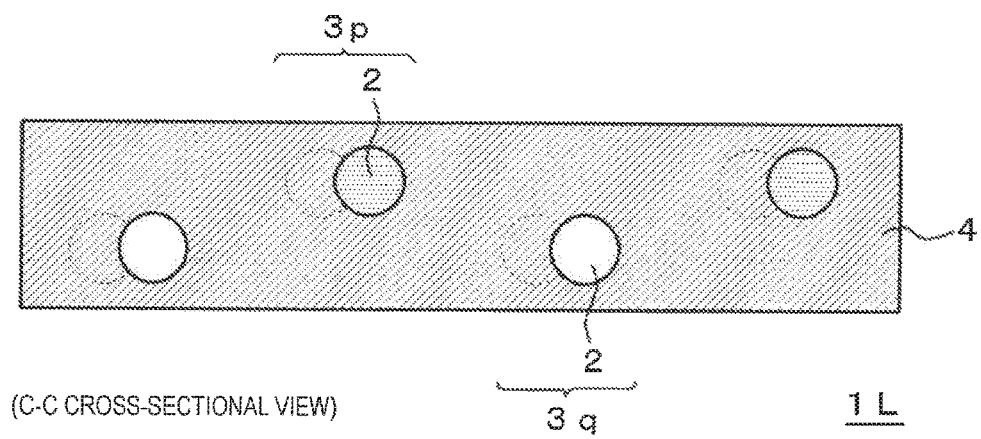
FIG. 13B is a cross-sectional view of the anisotropic conductive film 1L of the examples, taken along line C-C.

The disposal of the electrically conductive particles 2 in an anisotropic conductive film 1L illustrated in FIG. 13A is the same as that of the anisotropic conductive film 1A illustrated in FIG. 1 when viewed from above. However, as in the C-C cross-sectional view illustrated in FIG. 13B, first electrically conductive particle units 3p, in which the electrically conductive particles 2 are arranged at a first depth in a thickness direction of the anisotropic conductive film 1L, and second electrically conductive particle units 3q, in which the electrically conductive particles 2 are arranged at a second depth in the thickness direction of the anisotropic conductive film 1L, are alternately disposed in a short-side direction of the electrically conductive particle units 3p and 3q.

Figure 14A:
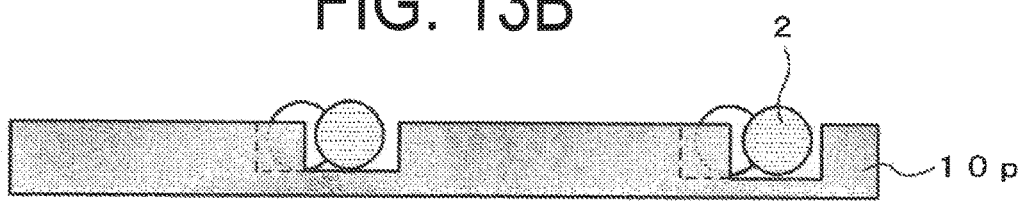
FIG. 14A is an explanatory view of a method of manufacturing the anisotropic conductive film 1L of the examples.
Figure 14A:
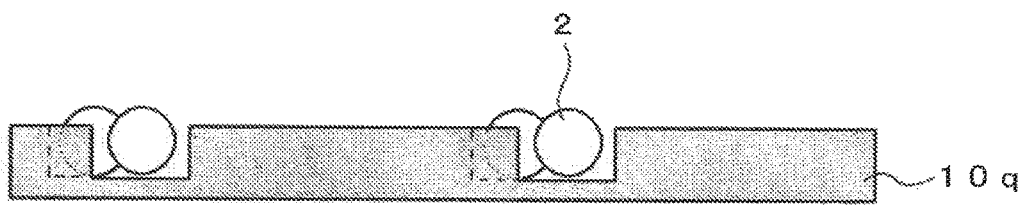
Figure 14B:
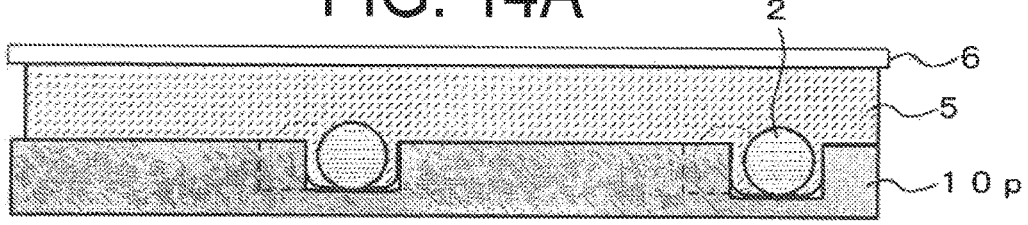
FIG. 14B is an explanatory view of the method of manufacturing the anisotropic conductive film 1L of the examples.
Figure 14B:
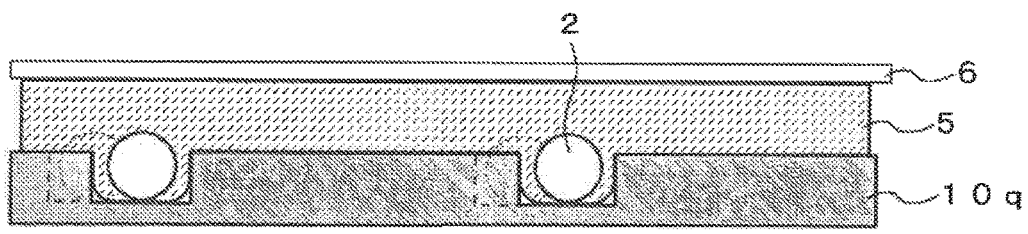
Figure 14C:
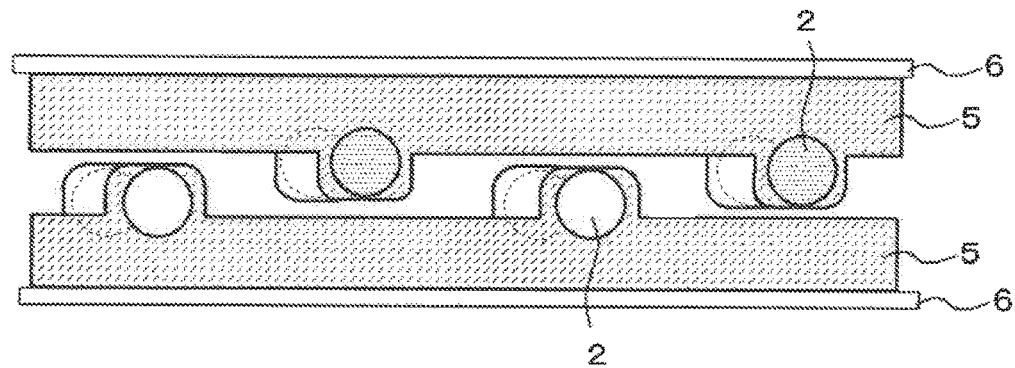
FIG. 14C is an explanatory view of the method of manufacturing the anisotropic conductive film 1L of the examples.

Methods of manufacturing the anisotropic conductive film 1L include a method in which, as illustrated in FIG. 14A, a first mold 10p for disposing the electrically conductive particles in the first electrically conductive particle units 3p and a second mold 10q for disposing the electrically conductive particles in the second electrically conductive particle units 3q are used. In this method, the recesses 11 of each of the molds 10p and 10q are filled with the electrically conductive particles 2, an insulating adhesive layer forming composition layer 5 formed on a release sheet 6 is disposed on each of the molds 10p and 10q as illustrated in FIG. 14B, the insulating adhesive layer forming composition layer 5 is pressed into the recesses 11 of the molds 10p and 10q, and the insulating adhesive layer forming composition layer 5 is semi-cured by drying, heating, or the like. Next, the semi-cured insulating adhesive layer forming composition layers 5 are removed from the molds 10p and 10q, are made to face each other as illustrated in FIG. 14C, are pressed, and the insulating adhesive layer forming composition layers 5 are fully cured by heating, UV light irradiation, or the like. Thus, the anisotropic conductive film 1L with the cross-section illustrated in FIG. 13B can be obtained.

With the method of manufacturing in which the first mold 10p and the second mold 10q are used, compared to a case in which a single mold is used, the disposal pitch of the recesses 11 in each mold can be widened and, as such, the manufacturing productivity of the anisotropic conductive film 1L can be improved.

The anisotropic conductive film of the present invention can be advantageously used when anisotropically conductively connecting a connection terminal of a first electronic component such as an IC chip, an IC module, an FPC, or the like to a connection terminal of a second electronic component such as an FPC, a glass substrate, a plastic substrate, a rigid substrate, a ceramic substrate, or the like. A connection structure obtained in this manner is also a part of the present invention. Additionally, first electronic components can be anisotropically conductively connected by stacking IC chips or IC modules. A connection structure obtained in this manner is also a part of the present invention.

Figure 15A:
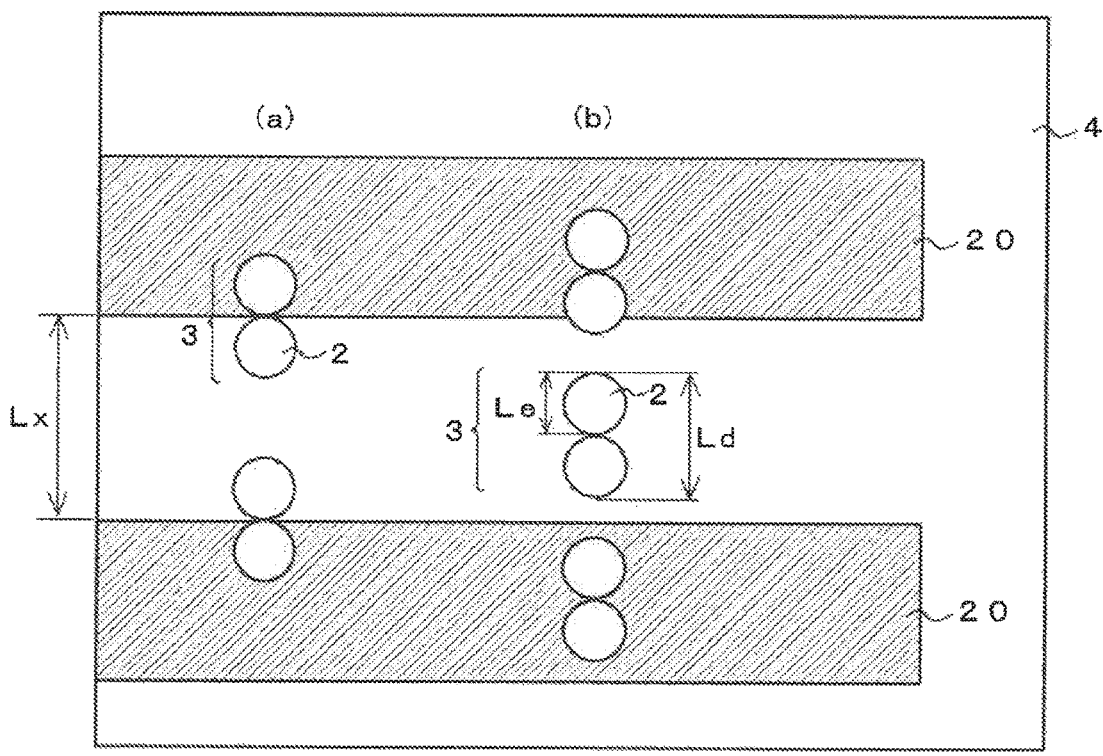
FIG. 15A is an explanatory view of a preferable disposal of electrically conductive particle units with respect to connection terminals.

In cases where using the anisotropic conductive film of the present invention to connect the connection terminals of electronic components, as illustrated in (a) of FIG. 15A, the electrically conductive particles 2 constituting the electrically conductive particle units 3 are preferably connected at a location not on the edges of the connection terminals 20. However, as illustrated in (b) of FIG. 15A, the length Ld of the electrically conductive particle units 3 in a direction of the distance Lx between the connection terminals 20 and the particle diameter Le of the electrically conductive particles 2 may be adjusted with respect to the distance Lx between the connection terminals 20 such that a relationship of the distance Lx between the connection terminals 20, the length Ld of the electrically conductive particle units 3 in the direction of the distance Lx between the connection terminals 20, and the particle diameter Le of the electrically conductive particles 2 satisfies Lx>(Ld+Le).

Figure 15B:
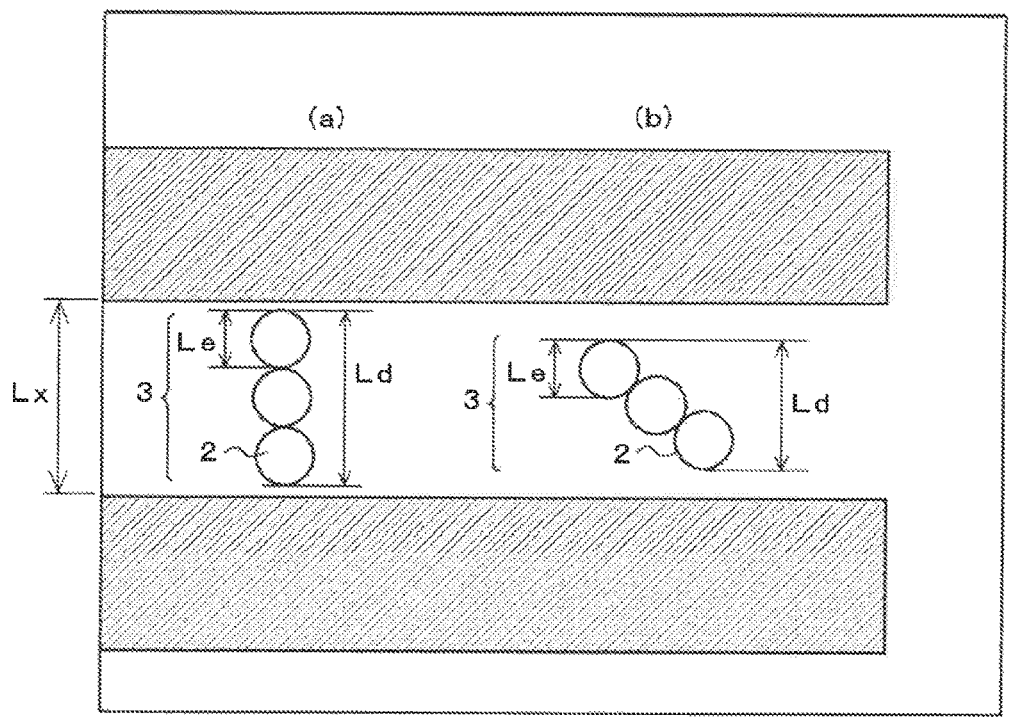
FIG. 15B is an explanatory view of a preferable disposal of electrically conductive particle units with respect to connection terminals.

In contrast, as illustrated in (a) of FIG. 15B, shorts occur more easily between the connection terminals 20 if Lx>(Ld+Le) is not satisfied. However, even if the particle diameter Le of the electrically conductive particles 2 constituting the electrically conductive particle units 3 and the number of the electrically conductive particles 2 arranged are uniform, as illustrated in (b) of FIG. 15B, the formula may be satisfied by configuring the longitudinal direction of the electrically conductive particle units 3 to be inclined with respect to the direction of the distance Lx between the terminals 20 so as to shorten the length Ld of the electrically conductive particle units 3 in the direction of the distance Lx between the terminals 20.

Figure 15C:
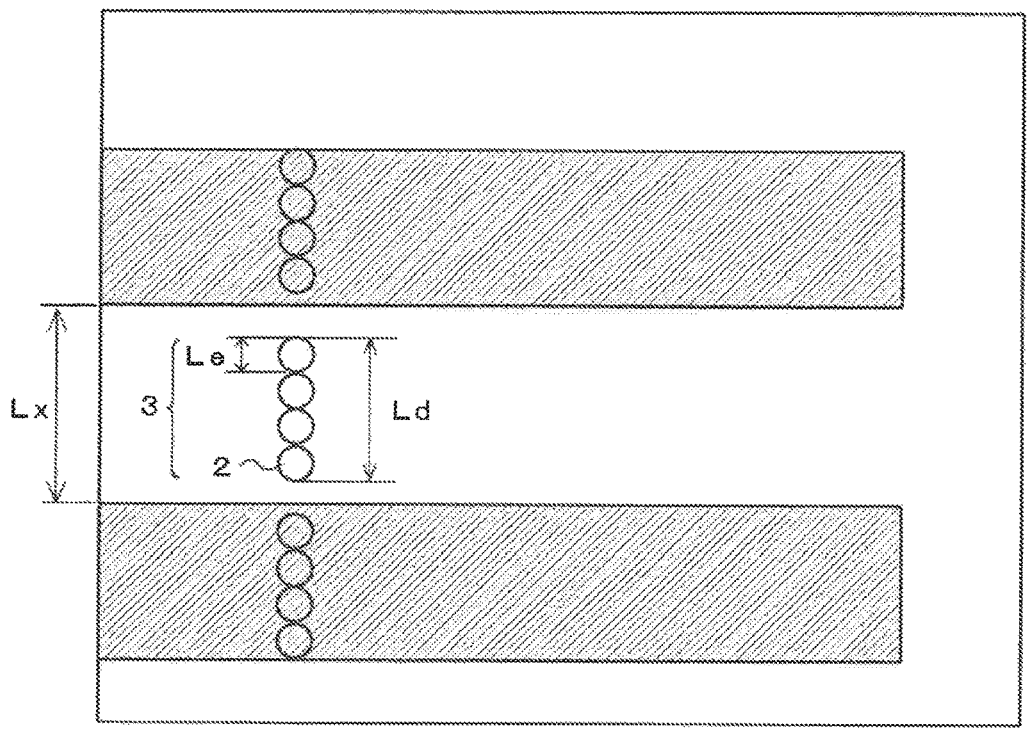
FIG. 15C is an explanatory view of a preferable disposal of electrically conductive particle units with respect to connection terminals.

Additionally, as illustrated in FIG. 15C, the aforementioned formula may be satisfied by reducing the particle diameter Le of the electrically conductive particles 2.

EXAMPLES

Next, the present invention will be described in detail using examples. Examples 1 to 11, Comparative Examples 1 and 2

Summary of Manufacture of Anisotropic Conductive Film

Anisotropic conductive films in which the disposal of the centers of electrically conductive particle units form a rectangular lattice were manufactured. In these anisotropic conductive films, the number of electrically conductive particles per one electrically conductive particle unit (hereinafter referred to as "number of connected particles"), a particle diameter (μm) of the electrically conductive particles, a maximum length (μm) of the electrically conductive particle unit, an angle θ of the longitudinal direction of the electrically conductive particle units with respect to the longitudinal direction of the anisotropic conductive film, a shortest distance La (μm) between electrically conductive particles of adjacent electrically conductive particle units, and a disposition density (particles/mm$^2$) of the electrically conductive particles were the numerical values shown in Table 1.

In this case, electrically conductive particles (particle diameters: 2 μm, 3 μm, and 6 μm) fabricated as described below were used as the electrically conductive particles.

Fabrication of Electrically Conductive Particles (Particle Diameters: 2 μm, 3 μm, and 6 μm)

Benzoyl peroxide, as a polymerization initiator, was added to a solution prepared by adjusting blended proportions of divinylbenzene, styrene, and butyl methacrylate. The mixture was polymerized by uniformly stirring at a high-speed while heating. Thus, a fine particle disposition was obtained. This fine particle disposition was filtered and dried under reduced pressure. Thus, an aggregate of fine particles, that is, a block body was obtained. Furthermore, the block body was crushed and classified by size. Thus, divinylbenzene-based resin particles with average particle diameters of 2 µm, 3 µm, and 6 µm were obtained.

A palladium catalyst was supported on the divinylbenzene resin particles (5 g) obtained in this manner by an immersing method. Next, these resin particles were subjected to electroless nickel plating using an electroless nickel plating solution (pH: 12, plating solution temperature: 50° C.) prepared from nickel sulfate hexahydrate, sodium hypophosphite, sodium citrate, triethanolamine, and thallium nitrate. Thus, nickel-coated resin particles, having a nickel plating layer (metal layer) formed on a surface thereof, were obtained as the electrically conductive particles. The average particle diameters of the obtained electrically conductive particles were 2 µm, 3 µm, and 6 µm.

12 g of the nickel-coated resin particles described above was mixed in a solution obtained by dissolving 10 g of sodium chloroaurate in 1000 mL of ion-exchanged water. Thus, an aqueous suspension was prepared. 15 g of ammonium thiosulfate, 80 g of ammonium sulfite, and 40 g of ammonium hydrogen phosphate were added to the obtained aqueous suspension. Thus, a gold plating bath was prepared. After adding 4 g of hydroxylamine to the gold plating bath, ammonia was used to adjust the pH of the gold plating bath to 9, and then the bath temperature was maintained at 60° C. for about 15 to 20 minutes. Thus, gold/nickel-coated resin particles with average particle diameters of 2 µm, 3 µm, and 6 µm were obtained and these were used as the electrically conductive particles.

Manufacture of Anisotropic Conductive Film

Anisotropic conductive films in which the electrically conductive particles were included in the insulating adhesive layer at the arrangements shown in Table 1 were manufactured as follows. First, a thermally polymerizable insulating resin composition containing 60 parts by mass of a phenoxy resin (YP-50, manufactured by Nippon Steel Sumikin Chemical Co., Ltd.), 40 parts by mass of an epoxy resin (jER 828, manufactured by Mitsubishi Chemical Corporation), and 2 parts by mass of a cationic polymerization initiator (latent curing agent) (SI-60L, manufactured by Sanshin Chemical Industry Co., Ltd.) was prepared. This composition was coated on a PET film having a film thickness of 50 µm and dried in an 80° C. oven for five minutes. Thus, an adhesive layer with a thickness of 20 µm was formed on the PET film.

Next, molds were fabricated wherein the disposals of convexities were the arrangements of the electrically conductive particle units shown in Table 1. Transparent resin pellets were melted, poured into the molds, cooled, and solidified. Thus, resin molds wherein the recesses had the disposals of the electrically conductive particle units shown in Table 1 were fabricated. The molds were filled with the electrically conductive particles and the electrically conductive particles were covered with the adhesive layer described above. The adhesive layer was cured using UV light irradiation and removed from the molds. Thus, anisotropic conductive films were manufactured.

Evaluation (a) Conduction resistance, (b) short number, (c) minimum number of particles captured per bump, and (d) state of particles between bumps were evaluated as follows. Results are shown in Tables 1A and 1B.

(a) Conduction Resistance

Conduction resistance of three types of connected objects for evaluation for which the effective connection area (area where the bump and substrate face each other) differed was evaluated.

(a-1) Conduction Resistance (Effective Connection Area: 400 µm²)

The anisotropic conductive film of each of the examples and the comparative examples was sandwiched between a conduction resistance evaluation IC and a glass substrate and heat pressed (180° C., 80 MPa, 5 seconds) so as to obtain each connected object for evaluation. Conduction resistance of each connected object for evaluation was measured by a digital multimeter in terms of values obtained when current of 2 mA was applied by a four-terminal method. If the value was less than 1Ω, the connected object for evaluation was evaluated as being suitable for practical use.

Here, the terminal patterns of the evaluation IC and the glass substrate corresponded to each other, and sizes thereof were as described below.

Additionally, in cases where connecting the evaluation IC and the glass substrate using the anisotropic conductive film, the longitudinal direction of the anisotropic conductive film was aligned with the short-side direction of the bumps (the direction of the distance between the terminals). Results are shown in Table 1A (FIG. 16A).

Conduction Resistance Evaluation IC
    Outer size: 0.7×20 mm
    Thickness: 0.2 mm
    Bump specifications: Gold plated; Height 12 µm; Size 10×40 µm; Distance between bumps 10 µm
Glass Substrate
    Glass material: Manufactured by Corning Inc.
    Outer size: 30×50 mm
    Thickness: 0.5 mm
    Electrode: ITO wiring (a-2) Conduction Resistance (Effective Connection Area: 300 µm²) and (a-3) Conduction Resistance (Effective Connection Area: 200 µm²)

Except for changing the bump specifications of the conduction resistance evaluation IC as follows, intentionally shifting the alignment of the evaluation IC by 6 µm or 8 µm in the short-side (width) direction of the bumps, and setting the effective connection area to 300 µm² or 200 µm², the conduction resistance evaluation IC was connected in the same manner as (a-1) to obtain the connected objects for evaluation, and the conduction resistance thereof was measured in the same manner as (a-1). Results are shown in Table 1B. Note that numerical values of the substantial bump size and the space between bumps of the IC (that is, conductor distance in the horizontal direction between bumps of the same IC) are shown in Table 1B (FIG. 16B).

Bump specifications: Gold plated; Height 12 µm; Size 12×50 µm; Distance between bumps 10 µm (b) Short Number The number of shorted channels at 100 spaces between bumps of the connected objects for conduction resistance evaluation of Examples 1 to 11 and Comparative Examples 1 and 2 were measured and set as the short number.

Note that the following short occurrence rate evaluation IC was used to measure the short occurrence rate of the anisotropic conductive films of Examples 1 to 11. In this case, all of the anisotropic conductive films had short occurrence rates of less than 200 ppm and displayed results suitable for practical use.

Short Occurrence Rate Evaluation IC
Comb Tooth TEG (Test Element Group)
    Outer size: 1.5×13 mm
    Thickness: 0.5 mm
    Bump specifications: Gold plated; Height 15 µm; Size 25×140 µm; Distance between bumps 7.5 µm (c) Minimum Number of Particles Captured Per Bump Using the anisotropic conductive films of each of the examples and the comparative examples, connected objects for evaluation (number of bumps: 100) were obtained in the same manner as in (a-1). The numbers of captured particles were measured and minimums thereof were found. Note that in these connections as well, the longitudinal direction of the anisotropic conductive film was aligned with the short-side direction of the bumps (the direction of the distance between the terminals). Results are shown in Table 1A.

Additionally, connected objects for evaluation (number of bumps of each: 100) were obtained in the same manners of (a-2) and (a-3), and the minimum number of particles captured at each bump was found in the same manner as described above and evaluated according to the following criteria. If the score was C or higher, the connected object for evaluation was evaluated as being suitable for practical use. Results are shown in Table 1B.

Evaluation Criteria
A (excellent): 10 or more particles
B (good): 5 or more and less than 10 particles
C (normal): 3 or more and less than 5 particles
D (poor): less than 3 particles (d) State of Particles Between Bumps (c) Numbers of occurrences of electrically conductive particle groups between the bumps, formed by electrically conductive particles that have become connected to each other and are not connected to the bumps, in the connected objects for evaluation (that is, connected objects for evaluation obtained in the same manner as (a-1), (a-2), and (a-3)) were counted. Count values per 100 spaces between bumps of electrically conductive particle groups, in which electrically conductive particle units or electrically conductive particles are connected with respect to a pre-connection state, are shown in Table 1A for connected objects for evaluation obtained in the same manner as (a-1).

The ease of movement of the electrically conductive particles in the anisotropic conductive connection (that is, the risk of shorting due to the electrically conductive particles contacting) can be evaluated from these count values.

The alignment was intentionally shifted in the connected objects for evaluation obtained in the same manner as (a-2) and (a-3) and, as such, these could not be compared on the same scale used for evaluating the connected objects for evaluation obtained in the same manner as (a-1). However, upon examination of 100 spaces between bumps, it was confirmed that no significant worsening had occurred. Additionally, for these connected objects for evaluation, locations where shorting appeared to be occurring were randomly extracted and the cross-sectional state of the connected object was examined. As a result, the cross-sectional shape of the connected objects for evaluation obtained in the same manner as (a-2) and (a-3) were not found to be significantly worse compared to the connected objects for evaluation obtained in the same manner as (a-1).

TABLE 1A

|  | Electronically conductive particle disposal | Number of connected particles | Parcticle diameter (μm) | Maximum length of unit (μm) | Angle θ (°) | Shortest distance of unit La (μm) |
|---|---|---|---|---|---|---|
| Example 1 | Arisotropic conductive from longitudinal direction (θ = 90) | 2 | 3 | 6 | 90 | 3 |
| Example 2 | (θ = 45) | 2 | 3 | 6 | 45 | 3 |
| Example 3 | (θ = 0) | 2 | 3 | 6 | 0 | 3 |
| Example 4 |  | 2 | 3 | 6 | 90 | 1.5 |
| Example 5 |  | 2 | 3 | 6 | 45 | 1.5 |
| Example 6 |  | 2 | 3 | 6 | 0 | 1.5 |
| Example 7 |  | 2 | 3 | 6 | 90 | 9 |
| Example 8 |  | 2 | 3 | 6 | 45 | 9 |

TABLE 1A-continued

| | | | | | | |
|---|---|---|---|---|---|---|
| Example 9 | | 2 | 3 | 6 | 0 | 9 |
| Example 10 | | 2 | 3 | 6 | 30 | 3 |
| Example 11 | | 2 | 3 | 6 | 60 | 3 |
| Comparative Example 1 | (diagram with La) | 1 | 6 | 6 | — | 3 |
| Comparative Example 2 | (diagram with La) | 1 | 6 | 6 | — | 3 |

| | (a-1) Connected object for evaluation 400 μm² (10 × 40 μm, space 10 μm) | | | | |
|---|---|---|---|---|---|
| | Particle density (pcs/mm²) | Conduction resistance (Ω) | Minimum number of particles captured per bump | State of particles between bumps | Short number |
| Example 1 | 37000 | 0.4 | 11 | 0/100 | 0/100 |
| Example 2 | 37000 | 0.4 | 12 | 0/100 | 0/100 |
| Example 3 | 37000 | 0.4 | 11 | 0/100 | 0/100 |
| Example 4 | 44000 | 0.4 | 13 | 0/100 | 0/100 |
| Example 5 | 44000 | 0.4 | 14 | 0/100 | 0/100 |
| Example 6 | 44000 | 0.4 | 13 | 0/100 | 0/100 |
| Example 7 | 28000 | 0.6 | 8 | 0/100 | 0/100 |
| Example 8 | 28000 | 0.5 | 9 | 0/100 | 0/100 |
| Example 9 | 28000 | 0.6 | 7 | 0/100 | 0/100 |
| Example 10 | 37000 | 0.4 | 12 | 0/100 | 0/100 |
| Example 11 | 37000 | 0.4 | 11 | 0/100 | 0/100 |
| Comparative Example 1 | 12000 | 0.8 | 2 | 8/100 | 4/100 |
| Comparative Example 2 | 12000 | 0.8 | 0 | 19/100 | 15/100 |

TABLE 1B

| | Electronically conductive particle disposal | Number of connected particles | Parcticle diameter (μm) | Maximum length of unit (μm) | Angle θ (°) | Shortest distance of unit La (μm) |
|---|---|---|---|---|---|---|
| Example 1 | Arisotropic conductive from longitudinal direction (θ = 90, diagram with La) | 2 | 3 | 6 | 90 | 3 |
| Example 2 | (θ = 45 diagram) | 2 | 3 | 6 | 45 | 3 |

TABLE 1B-continued

| | | | | | | |
|---|---|---|---|---|---|---|
| Example 3 | (diagram: 0 = 0) | 2 | 3 | 6 | 0 | 3 |
| Example 4 | | 2 | 3 | 6 | 90 | 1.5 |
| Example 5 | | 2 | 3 | 6 | 45 | 1.5 |
| Example 6 | | 2 | 3 | 6 | 0 | 1.5 |
| Example 7 | | 2 | 3 | 6 | 90 | 9 |
| Example 8 | | 2 | 3 | 6 | 45 | 9 |
| Example 9 | | 2 | 3 | 6 | 0 | 9 |
| Example 10 | | 2 | 3 | 6 | 30 | 3 |
| Example 11 | | 2 | 3 | 6 | 60 | 3 |

| | (a-1) Connected object for evaluation 400 μm² (10 × 40 μm, space 10 μm) | | | | |
|---|---|---|---|---|---|
| | Particle density (pcs/mm²) | Conduction resistance (Ω) | Minimum number of particles captured per bump | Conduction resistance (Ω) | Minimum number of particles captured per bump |
| Example 1 | 37000 | <1 | A | <1 | B |
| Example 2 | 37000 | <1 | A | <1 | B |
| Example 3 | 37000 | <1 | A | <1 | C |
| Example 4 | 44000 | <1 | A | <1 | A |
| Example 5 | 44000 | <1 | A | <1 | A |
| Example 6 | 44000 | <1 | A | <1 | B |
| Example 7 | 28000 | <1 | B | <1 | C |
| Example 8 | 28000 | <1 | B | <1 | C |
| Example 9 | 28000 | <1 | B | <1 | C |
| Example 10 | 37000 | <1 | A | <1 | B |
| Example 11 | 37000 | <1 | A | <1 | B |

From Table 1A, it is clear that in Examples 1 to 11, the conductive resistance is from 0.4 to 0.6Ω when the shortest distance La of the electrically conductive particle units is in a range of 0.5 to 3 times the particle diameter of the electrically conductive particles; but in Comparative Example 1 in which the electrically conductive particle units are not formed, the conductive resistance was high at 0.8Ω even when the shortest distance of the electrically conductive particles was 0.5 times the particle diameter of the electrically conductive particles. It is also clear from Table 1A that shorts occur at a comparatively higher frequency in Comparative Example 1.

Additionally, from Comparative Example 2, it is clear that the number of shorts increases significantly when the shortest distance La of the electrically conductive particle units is less than 0.5 times the particle diameter of the electrically conductive particles.

Furthermore, in Comparative Example 1 and Comparative Example 2, it is clear from the state of particles between the bumps that the particle diameter of the electrically conductive particles with respect to the distance between the bumps is too large and, thus, is not adapted to the bump layout. Particularly, in Comparative Example 2, the minimum number of captured particles per bump is 0. That is, there are situations where no electrically conductive particles are captured at the bumps. Thus, it is clear that the anisotropic connection in Comparative Example 2 is not stable. Thus, it is clear that anisotropic connections at fine pitches cannot be handled by simply increasing the particle diameter of the electrically conductive particles in order to increase the occupied area ratio of the electrically conductive particles.

Furthermore, from Examples 1 to 11, it is clear that in cases where the shortest distances La of the electrically conductive particle units are uniform, the minimum number of captured particles per bump increases and conduction reliability is high when the longitudinal direction of the electrically conductive particle units is inclined with respect to the longitudinal direction of the anisotropic conductive film.

On the other hand, it is clear from Table 1B that in (a-2) and (a-3), conduction performance greater than or equal to that of (a-1) was obtained, and the minimum number of captured particles per bump was good.

The conduction resistance after placing the connected objects for evaluation obtained in (a-1), (a-2), and (a-3) in a thermostatic chamber set to a temperature of 85° C. and a humidity of 85% RH for 500 hours was measured in the same manner as (a-1). As a result, in all of the connected objects for evaluation of the Examples, conduction resistance of less than 5Ω was confirmed and the same were confirmed as being suitable for practical use.

Reference Examples 1 to 5

Anisotropic conductive films for which the number of connected particles and arrangement of the electrically conductive particles were configured as shown in Table 2 were manufactured in the same manner as Example 1, and then evaluated. Results are shown in Table 2 (FIG. 17).

From Table 2, it is clear that the number of connected particles of the electrically conductive particles in the electrically conductive particle unit is not particularly limited in the short-side direction (longitudinal direction of the bumps) of the anisotropic conductive film (Reference Examples 1 and 2). However, it is also clear that for the direction of the distance between the bumps, if the sum of the maximum particle units and the distance between the terminals of the connection terminals.

As in Reference Examples 4 and 5, it is clear that shorts occur when the unit length is 90% or greater with respect to the distance between the bumps. It is also clear from the evaluation results of the state of particles between the bumps that there are more occurrences of units contacting between the bumps. As such, it is clear that the unit length parallel to the distance between the bumps must be set to a predetermined number of particles and size.

TABLE 2

| | Electronically conductive particle disposal | Number of connected particles | Parcticle diameter (μm) | Maximum length of unit (μm) | Angle θ (°) | Shortest distance of unit La (μm) |
|---|---|---|---|---|---|---|
| Reference Example 1 | Arisotropic conductive from longitudinal direction, θ = 90 | 3 | 3 | 9 | 90 | 3 |
| Reference Example 2 | | 4 | 2 | 8 | 90 | 1 |
| Reference Example 3 | θ = 0 | 3 | 2 | 6 | 0 | 1 |
| Reference Example 4 | | 3 | 3 | 9 | 0 | 3 |
| Reference Example 5 | | 4 | 3 | 12 | 0 | 3 |

| | Particle density (pcs/mm²) | Conduction resistance (Ω) | Short number | Minimum number of particles captured per bump | State of particles between bumps |
|---|---|---|---|---|---|
| Reference Example 1 | 42000 | 0.4 | 0/100 | 12 | 0/100 |
| Reference Example 2 | 89000 | 0.4 | 0/100 | 23 | 0/100 |
| Reference Example 3 | 86000 | 0.4 | 0/100 | 21 | 0/100 |
| Reference Example 4 | 42000 | 0.4 | 1/100 | 10 | 13/100 |
| Reference Example 5 | 44000 | 0.4 | 6/100 | 12 | 24/100 | length of the electrically conductive particle units and the electrically conductive particle diameter is greater than the size of the distance between the bumps, the short number increases (Reference Examples 3 to 5). Accordingly, even in cases where using the anisotropic conductive films of the Examples, it is clear that it is preferable to adjust the orientation of the anisotropic conductive film in accordance with the maximum length of the electrically conductive Examples 1 and 12 to 14

Anisotropic conductive films for which the connected numbers and arrangements of the electrically conductive particles were configured as shown in Table 3 were manufactured in the same manner as Example 1, and then evaluated. Results are shown in Table 3 (FIG. 18).

From Table 3, it is clear that in cases where the longitudinal direction of the electrically conductive particle units and the short-side direction of the anisotropic conductive film (the longitudinal direction of the connection terminals) are uniform, even if the spacing between the electrically conductive particles in each individual electrically conductive particle unit is discretionary varied from zero to a size ½ the particle diameter of the electrically conductive particles, a state in which the electrically conductive particle units are arranged in a lattice form can be formed, the short number can be reduced, and conduction reliability can be enhanced.

Lc Distance in longitudinal direction of anisotropic conductive film between closest electrically conductive particles, which are electrically conductive particles of adjacent electrically conductive particle units, that overlap in longitudinal direction of anisotropic conductive film
Ld Length of electrically conductive particle unit in direction of distance between connection terminals
Le Particle diameter of electrically conductive particle
Lh Distance between recesses adjacent in longitudinal direction of recesses of mold
Li Length in longitudinal direction of recess of recess of mold

TABLE 3

| | Electronically conductive particle disposal | | Number of connected particles | Parcticle diameter (μm) | Maximum length of unit (μm) | Angle θ (°) | Spacing between electrically conductive particles in unit Lj (μm) |
|---|---|---|---|---|---|---|---|
| Example 1 | Arisotropic conductive from longitudinal direction | 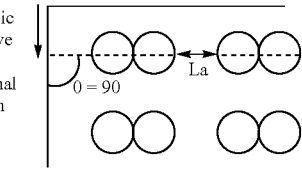 θ = 90  La | 2 | 3 | 6 | 90 | 0 |
| Example 12 | | | 2 | 3 | 6.6 | 90 | 0.6 |
| Example 13 | | | 2 | 3 | 7 | 90 | 1 |
| Example 14 | | | 2 | 3 | 7.2 | 90 | 1.2 |

| | Shortest distance of unit La (μm) | Particle density (pcs/mm$^2$) | Conduction resistance (Ω) | Short number | Minimum number of particles captured per bump | State of particles between bumps |
|---|---|---|---|---|---|---|
| Example 1 | 3 | 37000 | 0.4 | 0/100 | 11 | 0/100 |
| Example 12 | 2.4 | 37000 | 0.4 | 0/100 | 11 | 0/100 |
| Example 13 | 2 | 37000 | 0.4 | 0/100 | 12 | 0/100 |
| Example 14 | 1.8 | 37000 | 0.4 | 0/100 | 12 | 0/100 |

REFERENCE SIGNS LIST 1A, 1B, 1C, 1D, 1E, 1F, 1G 1H, 1I, 1J, 1K, 1L Anisotropic conductive film
2, 2a Electrically conductive particle
3, 3a, 3b, 3p, 3q, 3i, 3j, 3k Electrically conductive particle unit
4 Electrically insulating adhesive layer
5 Electrically insulating adhesive layer forming composition layer
6 Release sheet
10, 10p, 10q Mold
11 Recess
20 Connection terminal
D1 Longitudinal direction of anisotropic conductive film
D2 Short-side direction of anisotropic conductive film
La Shortest distance between electrically conductive particles selected from adjacent electrically conductive particle units and independent electrically conductive particles
La1 Length in longitudinal direction of anisotropic conductive film of shortest distance between adjacent electrically conductive particle unit
Lb Length in longitudinal direction of anisotropic conductive film of electrically conductive particle unit
Lj Total of lengths in longitudinal direction of recess of spacings after recesses of mold are filled with electrically conductive particles
Lx Distance between connection terminals
s1, s2, s3 Spacing
θ Angle of longitudinal direction of electrically conductive particle units with respect to longitudinal direction of anisotropic conductive film

The invention claimed is:
1. An anisotropic conductive film comprising:
electrically conductive particle units in which electrically conductive particles are arranged in a row, or electrically conductive particle units in which electrically conductive particles are arranged in a row and independent electrically conductive particles, disposed in a lattice form in an electrically insulating adhesive layer; wherein
a shortest distance between electrically conductive particles selected from adjacent electrically conductive particle units of the electrically conductive particle units and the independent electrically conductive particles is not less than 0.5 times a particle diameter of the electrically conductive particles.
2. The anisotropic conductive film according to claim 1, wherein:

a distance in a longitudinal direction between closest electrically conductive particles, which are electrically conductive particles of the adjacent electrically conductive particle units, that overlap in the longitudinal direction of the anisotropic conductive film is not less than 0.5 times the particle diameter of the electrically conductive particles.

3. The anisotropic conductive film according to claim 1, wherein:

a longitudinal direction of each of the electrically conductive particle units is inclined with respect to the longitudinal direction of the anisotropic conductive film.

4. The anisotropic conductive film according to claim 1, wherein:

a plurality of types of electrically conductive particle units are disposed for which a number of electrically conductive particles forming the electrically conductive particle unit differs.

5. The anisotropic conductive film according to claim 1, wherein:

the electrically conductive particle units comprise:

electrically conductive particle units in which an arrangement direction of the electrically conductive particles in the unit is a first direction, and electrically conductive particle units in which an arrangement direction of the electrically conductive particles in the unit is a second direction.

6. A connection structure comprising:

the anisotropic conductive film described in claim 1;

a first electronic component; and a second electronic component; wherein a connection terminal of the first electronic component and a connection terminal of the second electronic component are anisotropically conductively connected using the anisotropic conductive film.

7. The connection structure according to claim 6, wherein:

a distance between connection terminals is greater than a sum of a length of the electrically conductive particle unit in a distance direction between the connection terminals and a particle diameter of electrically conductive particles.

* * * * *